(12) United States Patent
Hammond et al.

(10) Patent No.: US 8,519,424 B2
(45) Date of Patent: Aug. 27, 2013

(54) USER CONFIGURABLE MOSAIC LIGHT EMITTING APPARATUS

(75) Inventors: Troy D. Hammond, Pittsburgh, PA (US); Lisa Pattison, Morgantown, WV (US); Venkataramanan Seshadri, Monroeville, PA (US)

(73) Assignee: Plextronics, Inc., Pittsburgh, PA (US)

( * ) Notice: Subject to any disclaimer, the term of this patent is extended or adjusted under 35 U.S.C. 154(b) by 831 days.

(21) Appl. No.: 12/543,446

(22) Filed: Aug. 18, 2009

(65) Prior Publication Data
US 2010/0076527 A1     Mar. 25, 2010

Related U.S. Application Data

(60) Provisional application No. 61/090,150, filed on Aug. 19, 2008, provisional application No. 61/222,033, filed on Jun. 30, 2009.

(51) Int. Cl.
*H01L 33/00* (2010.01)

(52) U.S. Cl.
USPC .............. 257/99; 257/E51.019; 257/E23.003; 257/E33.056; 257/E33.062; 257/E33.066

(58) Field of Classification Search
USPC ................ 257/88, 92, 99, E51.019, E23.003, 257/E23.078, E33.056, E33.057, E33.062, 257/E33.066, E25.02, E25.023
See application file for complete search history.

(56) References Cited

U.S. PATENT DOCUMENTS

| | | | |
|---|---|---|---|
| 4,538,214 A | 8/1985 | Fisher et al. | |
| 4,920,467 A | 4/1990 | Honsberger et al. | |
| 5,010,463 A | 4/1991 | Ross | |
| 5,404,282 A | 4/1995 | Klinke et al. | |
| 5,721,471 A | 2/1998 | Begemann et al. | |
| 6,016,038 A | 1/2000 | Mueller et al. | |
| 6,150,774 A | 11/2000 | Mueller et al. | |
| 6,183,104 B1 | 2/2001 | Ferrara et al. | |
| 6,234,645 B1 | 5/2001 | Borner et al. | |
| 6,241,527 B1 | 6/2001 | Rast et al. | |
| 6,255,786 B1 | 7/2001 | Yen | |

(Continued)

FOREIGN PATENT DOCUMENTS

| | | |
|---|---|---|
| CA | 2549232 | 12/2006 |
| CA | 2568430 | 10/2007 |

(Continued)

OTHER PUBLICATIONS

IB of WIPO, International Preliminary Report on Patentability and Written Opinion, PCT/US2009/054224, May 17, 2010, 19 pages.

(Continued)

*Primary Examiner* — Benjamin Sandvik
*Assistant Examiner* — Leslie Pilar Cruz
(74) *Attorney, Agent, or Firm* — The Marbury Law Group, PLLC

(57) ABSTRACT

Mosaic devices including an apparatus includes at least one electroluminescence (EL) device and a system substrate. The at least one EL device can be configured to be coupled mechanically and electrically to the system substrate. The system substrate can be configured to receive the at least one EL device at a non-discrete location or orientation. The system substrate can be a smart system substrate configured to automatically identify a device type. The EL device can be an area-emitting device such as an organic light emitting diode (OLED) device.

64 Claims, 14 Drawing Sheets

(56) References Cited

U.S. PATENT DOCUMENTS

| | | |
|---|---|---|
| 6,441,558 B1 | 8/2002 | Muthu et al. |
| 6,515,314 B1 | 2/2003 | Duggal et al. |
| 6,565,231 B1 | 5/2003 | Cok |
| 6,608,453 B2 | 8/2003 | Morgan et al. |
| 6,661,029 B1 | 12/2003 | Duggal |
| 6,683,665 B1 | 1/2004 | Matthies |
| 6,697,262 B2 | 2/2004 | Adams et al. |
| 6,776,496 B2 | 8/2004 | Cok et al. |
| 6,777,891 B2 | 8/2004 | Lys et al. |
| 6,806,659 B1 | 10/2004 | Mueller et al. |
| 6,846,093 B2 | 1/2005 | Swaris et al. |
| 6,897,624 B2 | 5/2005 | Lys et al. |
| 7,012,585 B2 | 3/2006 | Agostinelli et al. |
| 7,014,336 B1 | 3/2006 | Ducharme et al. |
| 7,038,398 B1 | 5/2006 | Lys et al. |
| 7,064,498 B2 | 6/2006 | Dowling et al. |
| 7,108,392 B2 | 9/2006 | Strip et al. |
| 7,108,396 B2 | 9/2006 | Swaris et al. |
| 7,135,824 B2 | 11/2006 | Lys et al. |
| 7,145,125 B2 | 12/2006 | May et al. |
| 7,148,470 B2 | 12/2006 | Rains et al. |
| 7,157,694 B2 | 1/2007 | May et al. |
| 7,161,313 B2 | 1/2007 | Piepgras et al. |
| 7,175,296 B2 | 2/2007 | Cok |
| 7,178,941 B2 | 2/2007 | Roberge et al. |
| 7,186,003 B2 | 3/2007 | Dowling et al. |
| 7,204,622 B2 | 4/2007 | Dowling et al. |
| 7,207,693 B2 | 4/2007 | Ratcliffe et al. |
| 7,241,043 B1 | 7/2007 | Wu et al. |
| 7,255,624 B2 | 8/2007 | Daftari et al. |
| 7,259,391 B2 | 8/2007 | Liu et al. |
| 7,262,753 B2 | 8/2007 | Tanghe et al. |
| 7,303,305 B2 | 12/2007 | Kennedy |
| 7,306,353 B2 | 12/2007 | Popovich et al. |
| 7,329,027 B2 | 2/2008 | Phelan et al. |
| 7,334,917 B2 | 2/2008 | Laski |
| 7,348,738 B2 | 3/2008 | Foust et al. |
| 7,354,172 B2 | 4/2008 | Chemel et al. |
| 7,365,991 B2 | 4/2008 | Aldrich et al. |
| 7,374,311 B2 | 5/2008 | Rains et al. |
| 7,387,403 B2 | 6/2008 | Mighetto |
| 7,387,405 B2 | 6/2008 | Ducharme et al. |
| 7,387,406 B2 | 6/2008 | Swaris et al. |
| 2001/0000005 A1 | 3/2001 | Forrest et al. |
| 2002/0068191 A1 | 6/2002 | Kobayashi |
| 2003/0052616 A1 | 3/2003 | Antoniadis et al. |
| 2003/0067775 A1 | 4/2003 | Nagai et al. |
| 2003/0080678 A1 | 5/2003 | Kim et al. |
| 2003/0202338 A1* | 10/2003 | Parker ................ 362/31 |
| 2004/0032205 A1 | 2/2004 | Hack et al. |
| 2004/0042199 A1 | 3/2004 | Cok |
| 2004/0132344 A1 | 7/2004 | Plishner |
| 2004/0178743 A1 | 9/2004 | Miller et al. |
| 2004/0195967 A1 | 10/2004 | Padiyath et al. |
| 2005/0012103 A1 | 1/2005 | Peng |
| 2005/0110384 A1 | 5/2005 | Peterson |
| 2005/0134525 A1 | 6/2005 | Tanghe et al. |
| 2005/0134526 A1 | 6/2005 | Willem et al. |
| 2005/0207165 A1 | 9/2005 | Shimizu et al. |
| 2005/0248935 A1 | 11/2005 | Strip et al. |
| 2006/0022214 A1* | 2/2006 | Morgan et al. ................ 257/99 |
| 2006/0043912 A1* | 3/2006 | Foust et al. ................ 315/312 |
| 2006/0044215 A1 | 3/2006 | Brody et al. |
| 2006/0053527 A1 | 3/2006 | Shneider |
| 2006/0077669 A1 | 4/2006 | Thielemans et al. |
| 2006/0109219 A1 | 5/2006 | Robinson et al. |
| 2006/0126338 A1 | 6/2006 | Mighetto |
| 2006/0163590 A1* | 7/2006 | Erchak et al. ................ 257/88 |
| 2006/0197456 A1 | 9/2006 | Cok |
| 2006/0232962 A1 | 10/2006 | Altman et al. |
| 2006/0245213 A1 | 11/2006 | Beil et al. |
| 2006/0262544 A1 | 11/2006 | Piepgras et al. |
| 2006/0285361 A1 | 12/2006 | Cok |
| 2007/0064425 A1 | 3/2007 | Frecska et al. |
| 2007/0070626 A1* | 3/2007 | Deguara ................ 362/249 |
| 2007/0098334 A1 | 5/2007 | Chen |
| 2007/0125368 A1 | 6/2007 | Silverstein et al. |
| 2007/0178771 A1 | 8/2007 | Goetz et al. |
| 2007/0188427 A1 | 8/2007 | Lys et al. |
| 2007/0215870 A1 | 9/2007 | Nam |
| 2007/0263394 A1 | 11/2007 | Thielemans et al. |
| 2007/0273290 A1 | 11/2007 | Ashdown et al. |
| 2007/0274084 A1 | 11/2007 | Kan et al. |
| 2008/0002399 A1 | 1/2008 | Villard et al. |
| 2008/0080163 A1 | 4/2008 | Grote et al. |
| 2008/0087464 A1 | 4/2008 | Patterson et al. |
| 2008/0088648 A1 | 4/2008 | Nathan et al. |
| 2008/0237981 A1 | 10/2008 | Gilles et al. |
| 2008/0298033 A1* | 12/2008 | Smith et al. ................ 361/772 |
| 2009/0009990 A1* | 1/2009 | Tseng ................ 362/158 |
| 2009/0086478 A1 | 4/2009 | Sanroma et al. |
| 2009/0114928 A1* | 5/2009 | Messere et al. ................ 257/88 |

FOREIGN PATENT DOCUMENTS

| | | |
|---|---|---|
| CA | 2604364 | 3/2008 |
| DE | 8801246 | 3/1988 |
| DE | 202006006417 | 11/2006 |
| EP | 1391918 | 2/2004 |
| EP | 1408722 | 4/2004 |
| EP | 1457962 | 9/2004 |
| EP | 1367675 | 7/2006 |
| FR | 2836985 | 9/2003 |
| JP | 1222610 | 9/1989 |
| JP | 6-214509 | 8/1994 |
| JP | 2004363421 | 12/2004 |
| JP | 2006-278307 | 10/2006 |
| JP | 2007-172918 | 7/2007 |
| JP | 2008307084 | 12/2008 |
| TW | 256026 | 6/2006 |
| WO | WO 03/044297 | 5/2003 |
| WO | WO 2005/101513 | 10/2005 |
| WO | WO 2006/043943 | 4/2006 |
| WO | WO 2006/056066 | 6/2006 |
| WO | WO 2006/063212 | 6/2006 |
| WO | WO 2006/097763 | 9/2006 |
| WO | WO 2006/122392 | 11/2006 |
| WO | WO 2006/123335 | 11/2006 |
| WO | WO2007045786 A1 * | 4/2007 |
| WO | WO 2007/107916 | 9/2007 |
| WO | WO2008037450 A1 * | 9/2007 |
| WO | WO 2007/144365 | 12/2007 |
| WO | WO 2008/001274 | 1/2008 |
| WO | WO 2008/012702 | 1/2008 |
| WO | WO 2008/019487 | 2/2008 |
| WO | WO 2008/037450 | 4/2008 |
| WO | WO 2008/040323 A2 | 4/2008 |
| WO | WO 2008/063864 | 5/2008 |
| WO | WO 2008/068718 | 6/2008 |
| WO | WO 2008/071206 | 6/2008 |
| WO | WO 2008/099306 | 8/2008 |
| WO | WO2008099306 A1 * | 8/2008 |
| WO | WO 2008/157723 | 12/2008 |
| WO | WO 2009/115955 | 9/2009 |

OTHER PUBLICATIONS

IB of WIPO, International Preliminary Report on Patentability and Written Opinion, PCT/US2009/054231, Apr. 23, 2010, 18 pages.
IB of WIPO, International Preliminary Report on Patentability and Written Opinion, PCT/US2009/054232, May 17, 2010, 19 pages.
IB of WIPO, International Preliminary Report on Patentability and Written Opinion, PCT/US2009/054228, Jun. 2, 2010, 21 pages.

* cited by examiner

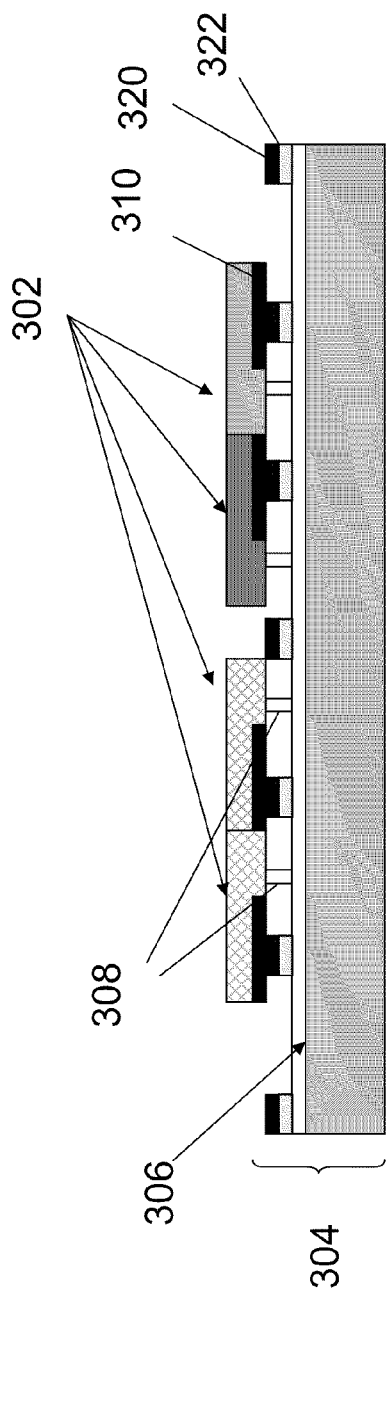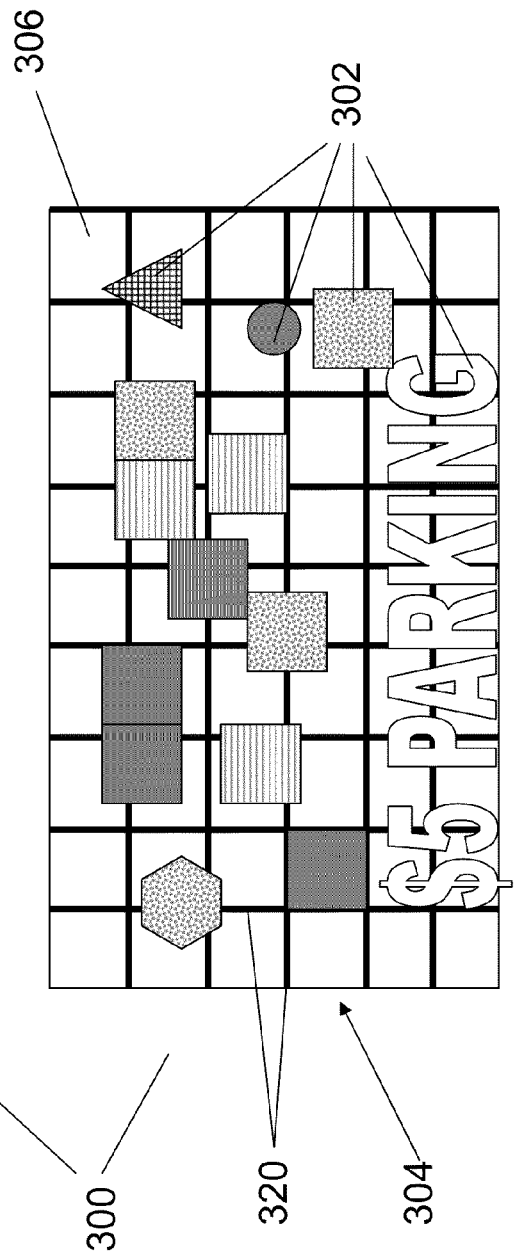

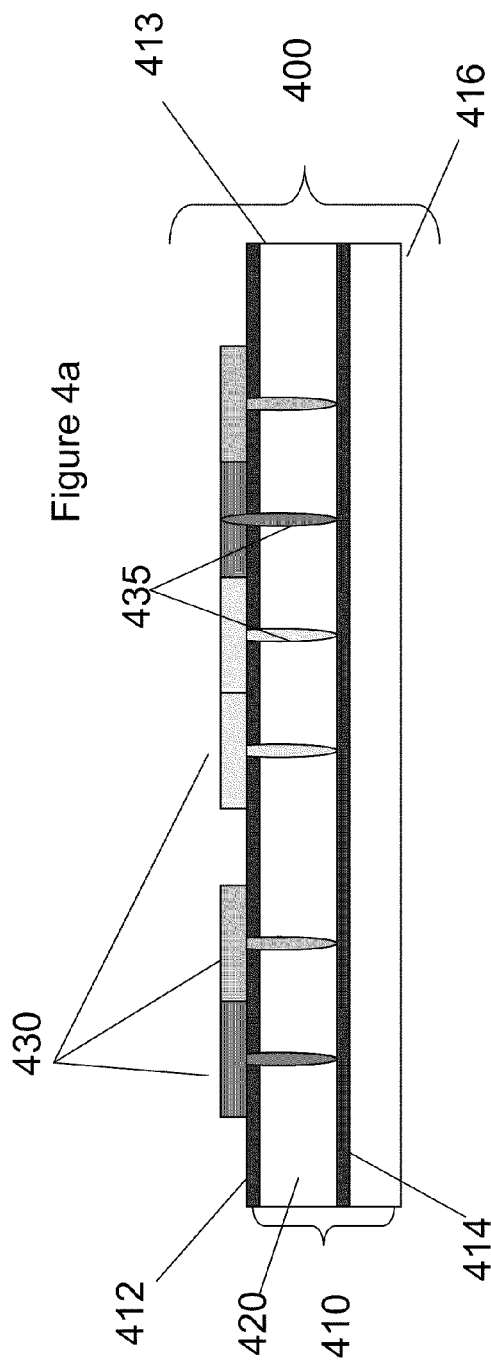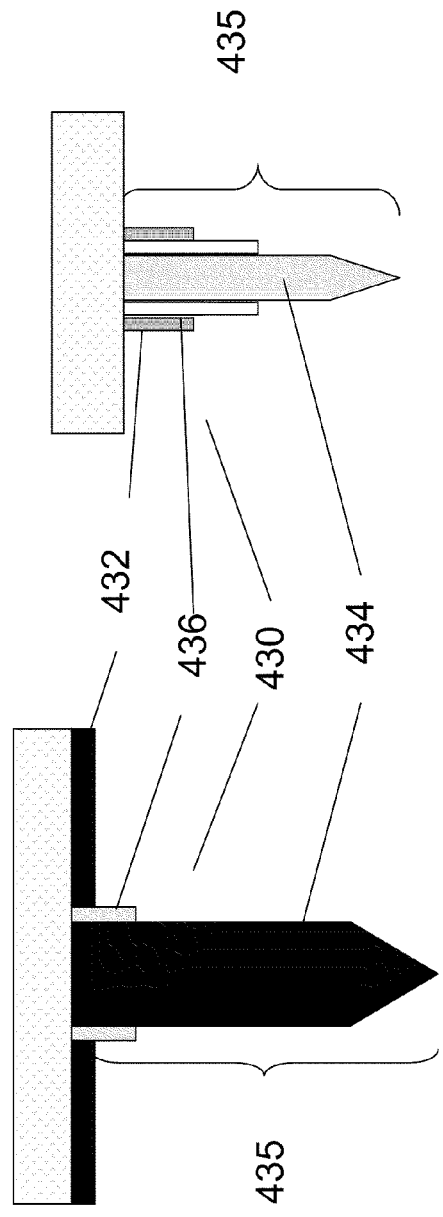

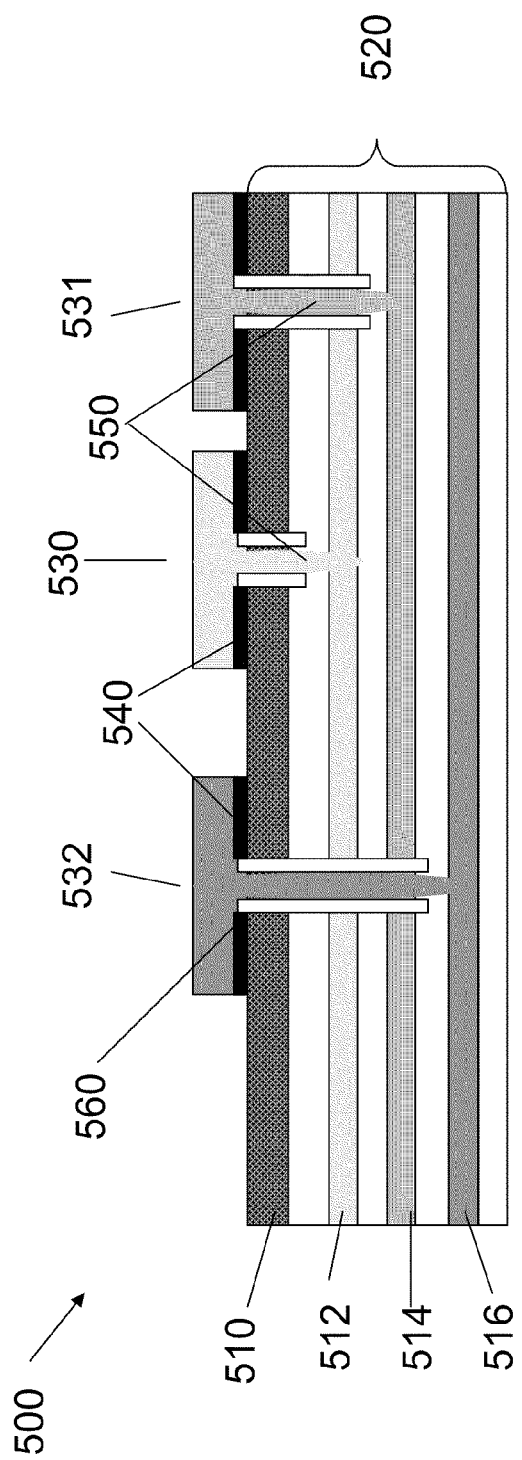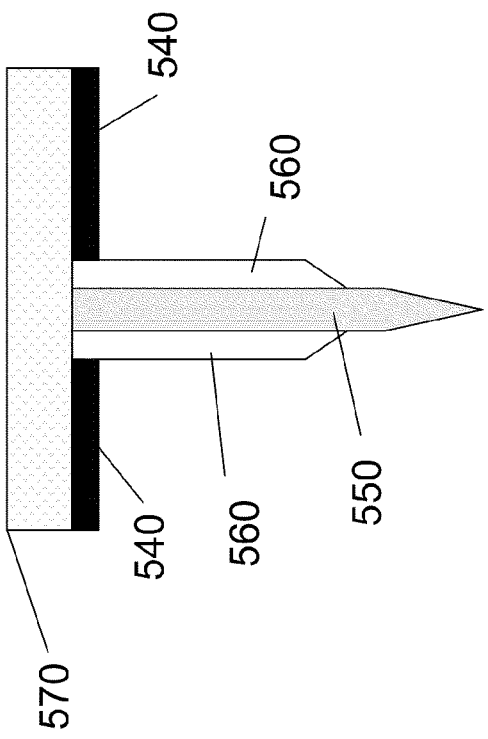
Figure 5a
Figure 5b

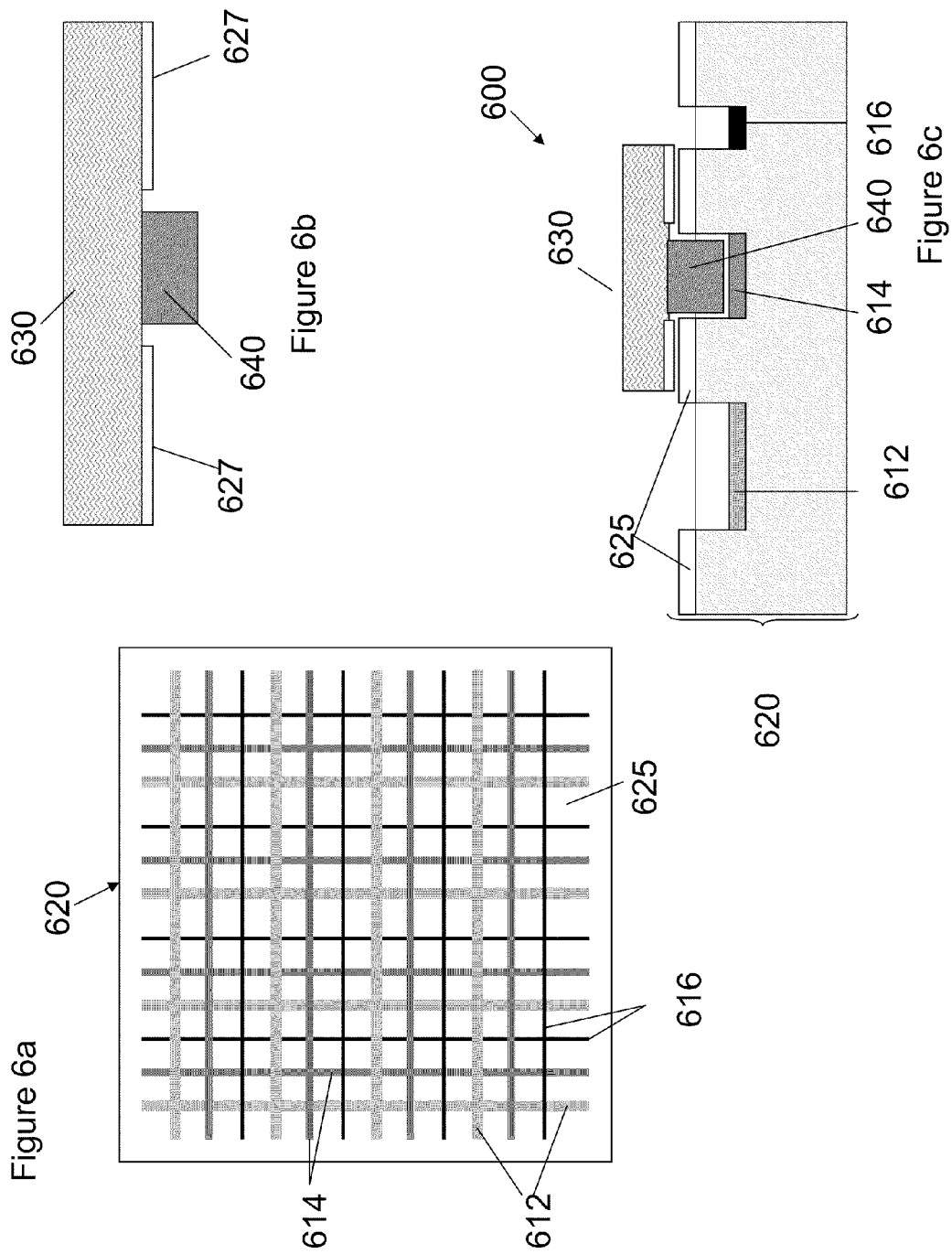

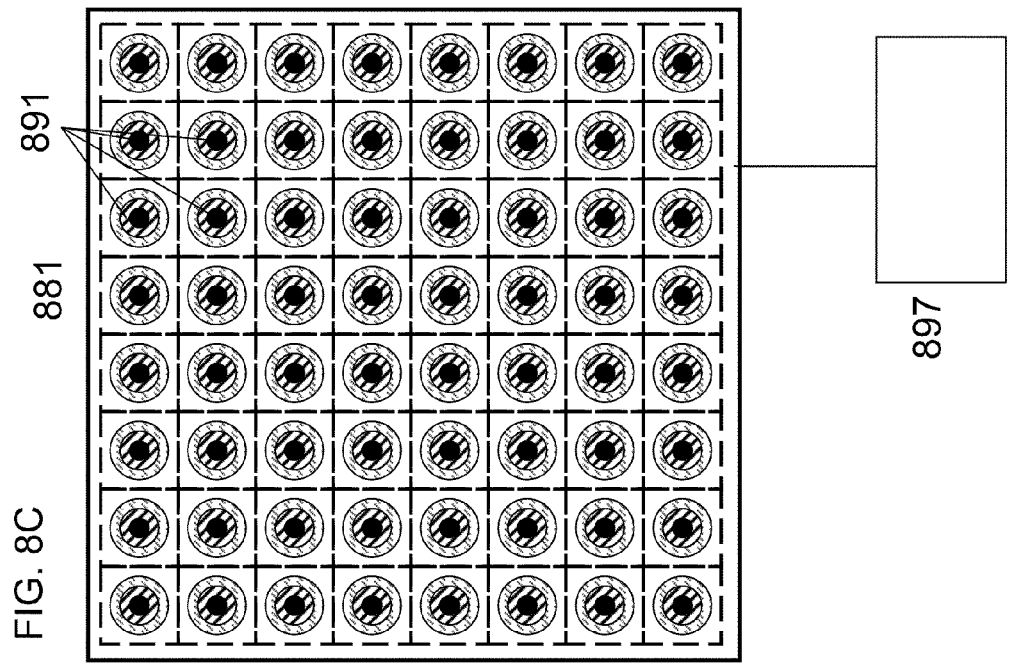
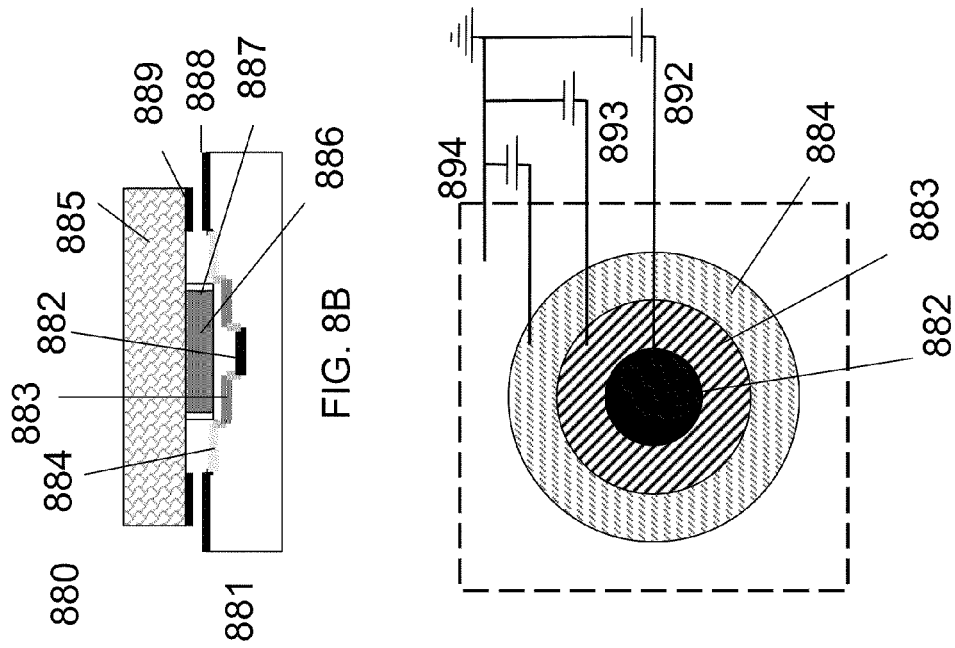

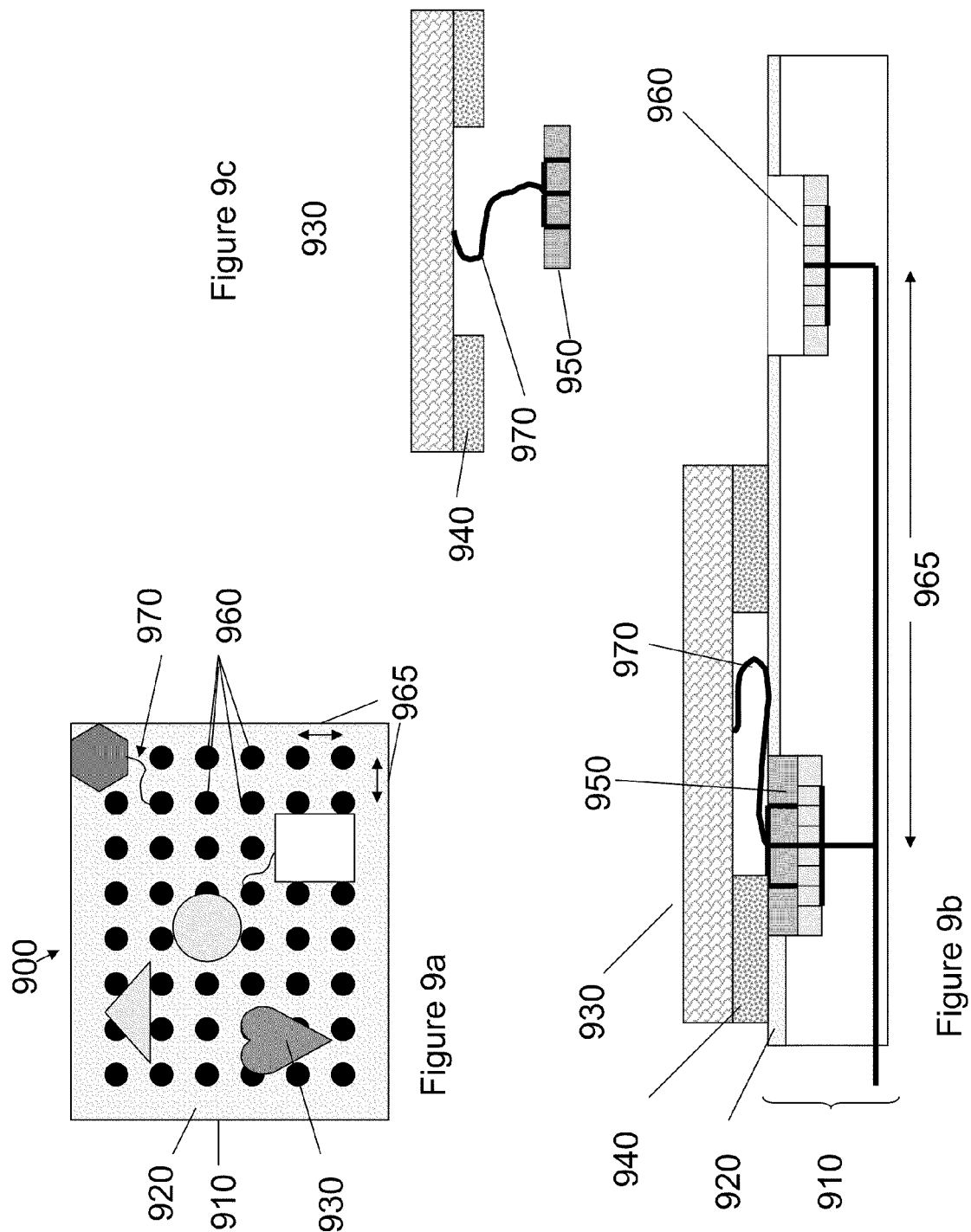

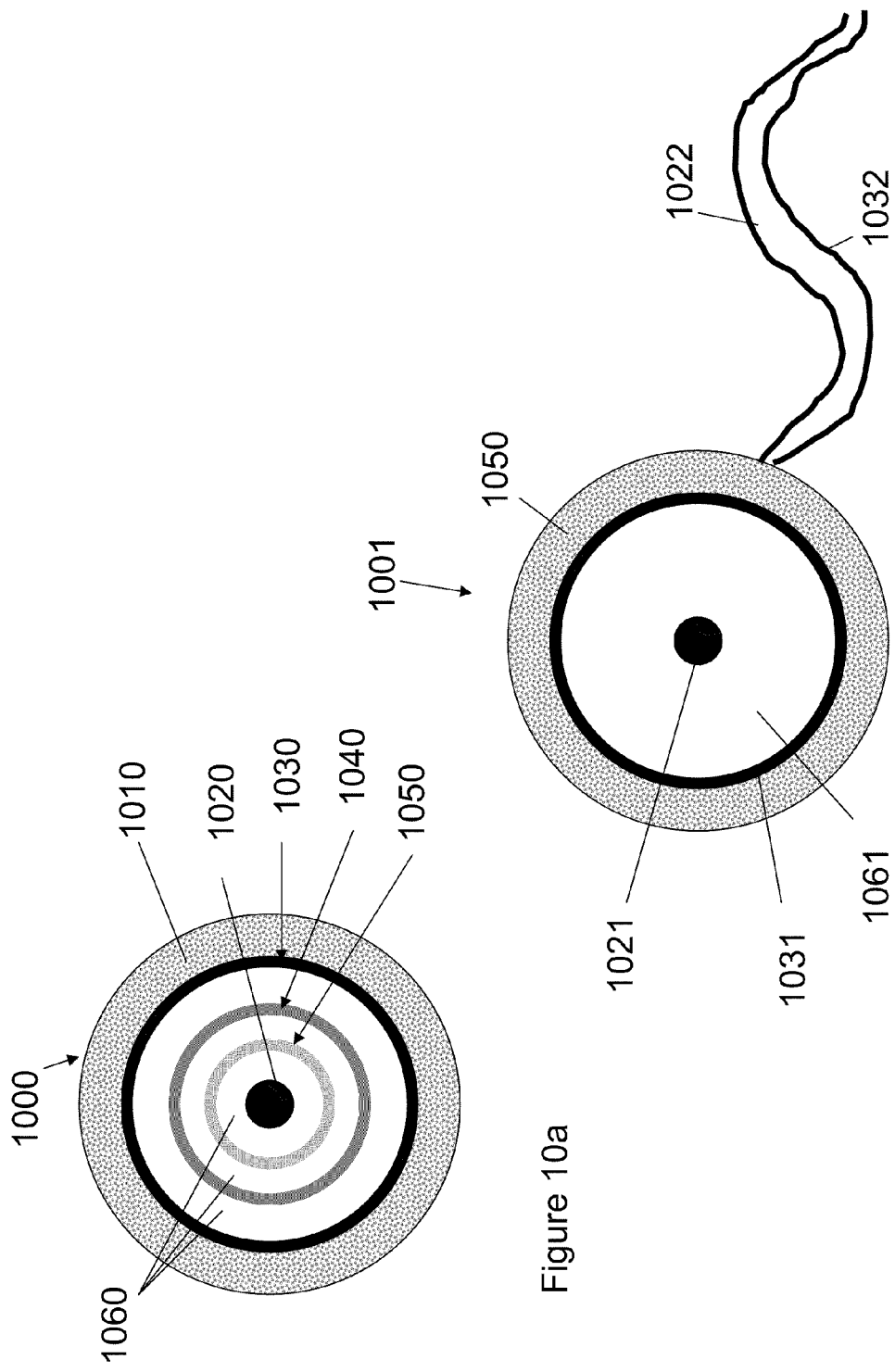

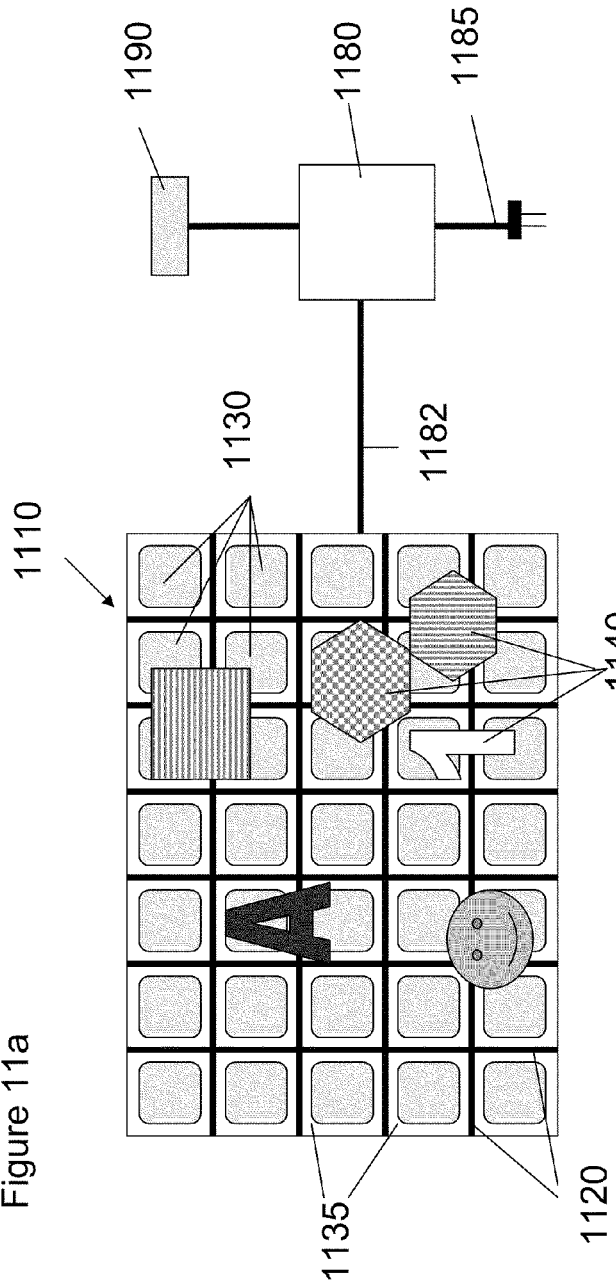
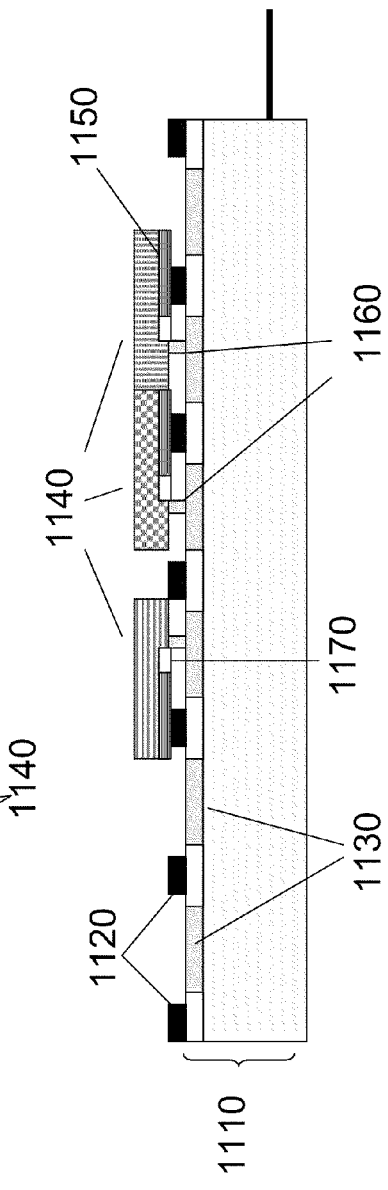

USER CONFIGURABLE MOSAIC LIGHT EMITTING APPARATUS

CROSS-REFERENCE TO RELATED APPLICATIONS

This application claims priority to U.S. Provisional Patent Application Nos. 61/090,150, filed on Aug. 19, 2008, and 61/222,033, filed on Jun. 30, 2009, the complete disclosures of both applications being hereby incorporated by reference in their entirety.

BACKGROUND

Electroluminescence (EL) is an opto-electronic phenomenon in which a material emits light in response to an electric current passing therethrough, or to a strong electric field. This is distinct from light emission resulting from heat (incandescence), chemical reaction (chemiluminescence), sound (sonoluminescence), or other mechanical action (mechanoluminescence).

EL devices come in many forms. They can have a common flat capacitor structure (bidirectional current pathway), or a diode structure (unidirectional current path). EL devices with bidirectional current pathways, such as HFELs, include alternating current (AC) and direct current (DC) driven devices and can have a powder or thin-film electroluminescent (TFEL) material. Unidirectional EL devices include light emitting diodes which can comprise inorganic or organic materials. The electroluminescent material in organic light emitting diodes (OLEDs) can include a small molecule material or a polymer material. Depending on the driving mechanisms of the EL devices, the terminologies of active matrix EL (AMEL) or passive matrix EL (PMEL) can be used.

In EL devices, the EL material is sandwiched between two electrodes. One electrode can be transparent to allow the escape of light produced by the EL material. Glass coated with indium tin oxide (ITO) is commonly used as the front (transparent) electrode while the back electrode can a reflective metal or coated with a reflective metal.

When a voltage is applied to the electrodes, the positive and the negative electrodes can provide injection of holes and electrons, respectively, into the EL material. In the EL material, electrons and holes move towards each other in the applied electrical field and form excitons, which are bound excited states that can relax down into the ground state radiatively by emitting a photon. This process can be referred to as electroluminescence. EL devices are of interest in, for example, display, signage, and lighting.

OLEDs were first designed in the 1980s, see, e.g., C. W. Tang, S. A. Van Slyke, Organic Electroluminescent Diodes, *Appl. Phys. Lett.*, 1987, 51, 913. More recent developments in OLED materials and applications are generally described in Kraft et al., *Angew. Chem. Int. Ed.*, 1998, 37, 402-428, and Z., Li and H. Meng, *Organic Light-Emitting Materials and Devices* (Optical Science and Engineering Series), CRC Taylor & Francis (Sep. 12, 2006). The disclosures of these references are incorporated by reference in their entirety.

Oleg Vladimirovich Losev independently created the first LED in the mid 1920s and his research was distributed in Russian, German and British scientific journals. LEDs are fabricated from inorganic materials, such as indium, aluminum, gallium, arsenic and/or nitrogen. LEDs have been commercially available since the 1960s. LEDs are manufactured in small, discrete packages and are point light sources. More recent developments in LED materials and applications are generally described in E. Fred Schubert, *Light Emitting Diodes*, Cambridge University Press (Jun. 9, 2003). The disclosure of this reference is incorporated by reference in its entirety.

High field electroluminescence was first observed in silicon carbide (SiC) by Captain Henry Joseph Round in 1907. Round reported that a yellow light was produced when a current was passed through a silicon carbide detector. The first thin-film EL structures were fabricated in the late 1950s by Vlasenko and Popkov. These two scientists used a thin film of Zinc Sulfide doped with Manganese (ZnS:Mn). In 1974, Toshio Inoguchi and his colleagues at Sharp Corporation introduced an alternating current (AC) TFEL approach to EL displays at the annual meeting of the Society for Information Display. The Sharp device was a high-brightness, long-life-time EL device which used zinc sulfide doped with manganese (ZnS:Mn) as the phosphor layer, and yttrium oxide ($Y_2O_3$) for the sandwiching insulators. More recent developments in electroluminescent materials and applications are generally described in Yoshimasa Ono, *Electroluminescent Displays*, World Scientific Publishing Company (June 1995), D. R. Vij, *Handbook of Electroluminescent Materials*, Taylor & Francis (February 2004), and Seizo Miyata, *Organic Electroluminescent Materials and Devices*, CRC (July 1997). The disclosures of these references are incorporated by reference in their entirety.

SUMMARY

Described herein are embodiments which include, among other things, devices, articles, instruments, apparatuses, kits, systems, and the like, and methods of making and methods of using the same. More specifically, the various embodiments described in this application can generally relate to light emitting apparatuses comprising EL devices that mechanically and electrically couple to a system substrate at a user-defined location which can be at a non-discrete location or orientation.

In particular, the embodiments are related to user-configurable light mosaics. The EL devices can be organic, inorganic, hybrid (organic/inorganic) devices, or a combination thereof, and can be in the form of OLEDs, LEDs, or thin film or powder electroluminescents. EL devices can have a variety of colors, shapes, and sizes and can be configured to be removably coupled mechanically and electrically to a system substrate which connects the devices to a power supply.

Some of the embodiments disclosed herein are related to an apparatus comprising at least one EL device and at least one system substrate, wherein the at least one EL device is configured to be coupled mechanically and electrically to the system substrate, and wherein the system substrate is configured to receive the at least one EL device at a non-discrete location or orientation.

Other embodiments relate to an apparatus comprising a system substrate and at least one EL device configured to be coupled mechanically and electrically to the system substrate, and a control module configured to independently drive the EL device. The control module can be configured to drive the EL devices based on a user input, information collected by a sensor, or an EL device characteristic identified by an identification device.

Some embodiments relate to kits. A kit comprises a plurality of electroluminescence (EL) devices and at least one system substrate wherein at least some of the EL devices are configured to be coupled mechanically and electrically to the system substrate and wherein the system substrate is configured to receive at least some of the EL devices at a non-discrete location or orientation.

Further embodiments relate to methods of creating the apparatuses. These methods include selecting a plurality of EL devices and electrically and mechanically coupling the EL devices to at least one system substrate at a non-discrete location or orientation.

In one embodiment, a method of treatment is provided. This method includes determining a condition of a patient to be treated, prescribing at least one phototherapeutic wavelength and treatment duration to treat the condition, determining an area of the patient to be illuminated by the phototherapeutic wavelength, selecting at least one EL device of the prescribed phototherapeutic wavelength, coupling the selected at least one EL device to at least one system substrate at a non-discrete location or orientation, mounting the system substrate over the area of the patient to be illuminated, and powering the EL devices.

In other aspects, an apparatus is provided, comprising at least one area-emitting EL device and a system substrate. The at least one EL device is configured to be coupled mechanically and electrically to the system substrate and the system substrate is configured to receive the at least one EL device at a discrete location.

At least one advantage of at least one embodiment includes user-configurable modular light emitting mosaics with light emitting elements disposed at non-discrete locations on a system substrate.

At least one advantage of at least one embodiment includes a smart system substrate configured to automatically identify a device type.

Other embodiments and advantages will become apparent with reference to the following descriptions.

BRIEF DESCRIPTION OF FIGURES

FIG. 3a is a cross-sectional view of an example light emitting apparatus.

FIG. 3b is a top plan view of the light emitting apparatus of FIG. 3a.

FIG. 4a is a cross-sectional view of a "push pin" example of a light emitting apparatus.

FIG. 4b is a cross-sectional view of a "push pin" EL device with a back surface electrode and a post electrode which are insulated from one another.

FIG. 4c is a cross-sectional view of a "push pin" EL device with a first electrode and a second post electrode insulated from each other with an insulating sheath.

FIG. 5a is a cross-sectional view of a "push pin" light emitting apparatus with multiple conductive layers in the system substrate.

FIG. 5b is a cross-sectional view of a "push pin" EL device compatible with the apparatus of FIG. 5a.

FIG. 6a is a top plan view of a system substrate for a light emitting apparatus using multiple recessed grids as conductive paths.

FIG. 6b is a cross-sectional view of an EL device compatible with the system substrate of FIG. 6a.

FIG. 6c is a cross-sectional view of a light emitting apparatus using the components illustrated in FIGS. 6a and 6b.

FIG. 8b is a cross-sectional view of a light emitting apparatus wherein an EL device is coupled to a system substrate comprising multiple conductive recessed arrays that are vertically and laterally displaced.

FIG. 8c is a top view of the system substrate of 8b.

FIG. 8d is a close up of the top view of the system substrate of 8b.

FIG. 9a is a top plan view of a light emitting apparatus wherein the EL devices are coupled to the system substrate through plugs attached to the EL devices with electrical leads.

FIG. 9b is a cross-sectional view of the light emitting apparatus of FIG. 9a.

FIG. 9c is another cross-sectional view of the EL device of FIG. 9a.

FIG. 10a is a top plan view of a magnetic receptacle comprising a first, ground conductive path and three additional conductive paths providing different drive conditions.

FIG. 10b is a bottom view of a magnetic plug comprising a first ground electrode configured to connect to the first conductive path of a magnetic receptacle, and an additional electrode configured to align with one of the additional conductive paths of the magnetic receptacle shown in FIG. 10a.

FIG. 11a is a schematic diagram of a light emitting apparatus with a first, common conductive path in the form of a grid and an addressable array of conductive paths.

FIG. 11b is a cross-sectional view of the light emitting apparatus of FIG. 11a.

DETAILED DESCRIPTION

Introduction

Figure 1:
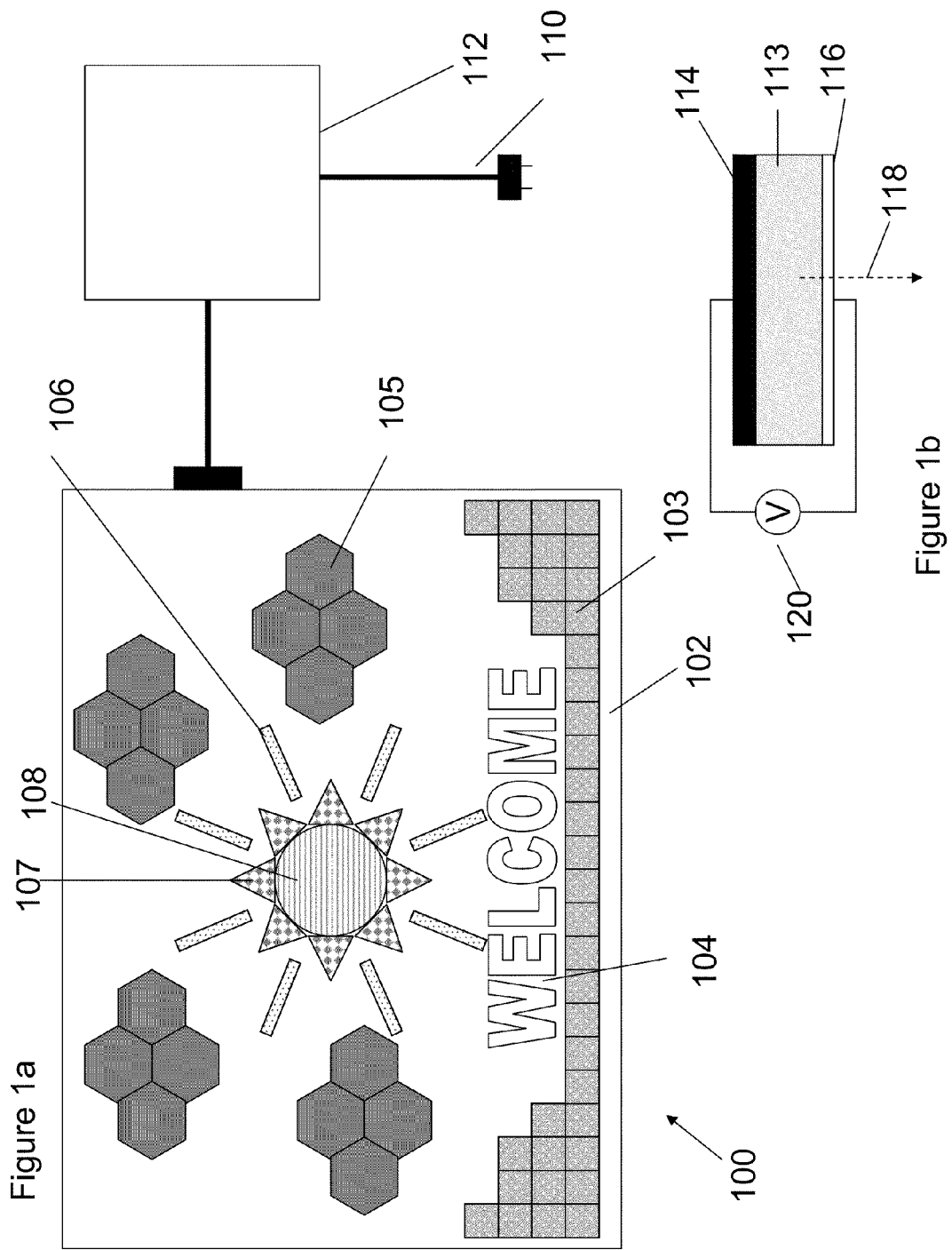
FIG. 1a is a schematic diagram of an example of a light emitting apparatus in accordance with an embodiment.
FIG. 1b is a cross-sectional view of an EL device.

All references cited in this application are hereby incorporated by reference in their entirety. In particular, the disclosures of the following U.S. Provisional Applications: "ORGANIC LIGHT EMITTING DIODE LIGHTING DEVICES" filed Aug. 19, 2008 having Ser. No. 61/090,150; "ORGANIC LIGHT EMITTING DIODE LUMINAIRES" filed Oct. 2, 2006 having Ser. No. 61/102,330; and "ORGANIC LIGHT EMITTING DIODE LIGHTING SYSTEMS" filed on Oct. 2, 2008 having Ser. No. 61/102,326 are all hereby incorporated by reference in their entirety.

EL devices, including area emitting EL devices, have previously been used in light emitting apparatuses. Some apparatuses have been described in U.S. patent application Ser. No. 11/294,232 (Pub. No. 20070125368), and U.S. patent application Ser. No. 11/904,742 (Pub. No. 20090086478). Some of the apparatuses allow removable coupling of more than one EL device to a mount which connects the devices to a power supply. The positioning freedom is limited to the choice of a discrete position on a grid of couplers, or it is limited to lateral positioning freedom in only one dimension.

Terminology

The term EL device as used herein should be interpreted to embrace high field EL devices, conventional inorganic semiconductor diode devices such as LEDs, as well as OLEDs (with or without a dopant in the active layer) which can be made with major dimensions ranging from millimeters to several inches and beyond. The term EL device excludes incandescent lamps, fluorescent lamps, and electric arcs. EL devices can be categorized as high field EL devices or diode devices and can further be categorized as area emitting EL devices and point source EL devices. Area emitting EL devices include high field EL devices and OLEDs. Point source devices include inorganic LEDs.

The term "dopant" as used herein can mean a dopant atom (generally a metal) as well as metal complexes and metalorganic compounds as an impurity within the active layer of an EL device. Some of the organic-based EL device layers may not contain dopants.

The term "color" as used herein can mean a wavelength or any combination of monochromatic light in the visible range of electromagnetic radiation, such as red, orange, yellow, green, blue, violet, or white, or a wavelength in the near infrared range, or the UV range of light. EL devices can emit light of a plurality of wavelengths and their emission peaks can be very broad or narrow.

The term "plurality" has the meaning of "one or more."

The term "non-discrete location or orientation" as used herein means that there is freedom in at least one of the lateral positioning or rotational positioning of the EL device on the system substrate.

When the term "grid" or "array" is used, the grid or array does not need to have a regular period. The array can be a line array. In some embodiments, the system substrate comprises an array of conductive paths. The array of conductive paths can comprise conductive regions on the system substrate surface which are electrically connected to a control module or power supply through electrical vias built into the system substrate.

The term "drive condition" as used herein means a drive voltage or current used to power the EL devices. The drive conditions can vary with time and can be programmed to change in response to feedback from a sensor or user input.

The term "area emitting EL device" as used herein means an EL device with a light emitting area of >5 mm$^2$ and is not used to include point source emitters such as inorganic LEDs with smaller light emitting areas unless it further comprises optics to spread the light to make the point source emitter behave like an area emitting EL device.

Light Emitting Apparatus

In some embodiments, novel coupling schemes are employed to electrically and mechanically couple the EL device to the system substrate. The positioning freedom enables mosaics or patterns to be formed with fewer geometrical restrictions. The EL devices can also be removably coupled to the system substrate. Conductive adhesives, hook-and-loop connectors, beaded stem fasteners, push pins, and magnets are some of the coupling members that are disclosed herein. Many of these coupling members are suitable for coupling even very large area emitting EL devices to a system substrate.

Embodiments described herein can enable different drive conditions to be applied to the appropriate EL devices. Thus, the EL devices can also have a variety of shapes, sizes, and colors of emitted light, and still be efficiently driven. In some embodiments, the EL device is electrically connected to one of a selection of conductive paths. In other embodiments, the system substrate is a "smart system substrate" with the ability to individually address and drive each EL device electrically coupled to the system substrate. The "smart system substrate" uses a characteristic of the EL device, a user input, or information collected by a sensor to determine the appropriate drive conditions to be applied. These factors allow the user to create a light mosaic. Such light emitting apparatuses can be used for a variety of applications including, for example, signage, decorative lighting, phototherapeutic treatments, grow lighting, photographic lighting devices, and general illumination.

In some embodiments, the light emitting apparatus is user configurable. The light emitting apparatuses can include at least one electroluminescent (EL) device of a light emitting diode (inorganic or organic) or a high field EL (HFEL) such as an inorganic powder or thin film electroluminescent (TFEL). The EL devices can have a variety of shapes, sizes and colors of emitted light. In addition, the EL devices can be configured to be removably coupled to a system substrate mechanically and electrically. The system substrate serves as a mount and connects the EL devices to a power supply.

Coupling mechanisms disclosed herein can permit a large degree of translational and rotational freedom of placement of the EL device on the system substrate. This freedom in EL device positioning and the availability of a variety of EL device colors and shapes allows the user to define freely a light mosaic. Embodiments are described allowing for different drive conditions to be applied to different EL devices and allowing for the system substrate to determine how an EL device should be driven based on a characteristic of the EL device, a user input, or information collected by a sensor. Such light emitting apparatuses can be used for a variety of applications including signage, decorative lighting, games, phototherapy, grow lights, advertising, display lights, architecture lighting, consumer novelty items, and general illumination.

In some embodiments, a light emitting apparatus includes a combination of a system substrate and EL devices in which the EL devices can be positioned on the system substrate at a non-discrete location or orientation such that the light mosaic can be configured by a user. The electrical and mechanical coupling mechanisms enable area emitting EL devices to be used. In addition, electrical coupling mechanisms can allow for a plurality of drive conditions to be available to the EL devices so that EL devices with different sizes and emission wavelengths can be driven effectively, and wear leveling and color tuning are enabled.

An example light emitting apparatus 100 is illustrated in FIG. 1a. The apparatus 100 comprises at least one system substrate 102 and one or more EL devices 103-108. The light emitting apparatus 100 is configured to connect to an external power supply through a cable 110 and is electrically connected to a control module 112 that can be used to drive the EL devices based on information gathered from a sensor, electronic interface, or other device. A cross-sectional view of an EL device is shown in FIG. 1b. The EL devices are configured to be mechanically and electrically coupled to the system substrate 102. The system substrate 102 is configured to receive the EL devices 103-108 at non-discrete locations or orientations. The EL devices can be removably coupled to the system substrate.

The EL devices 103-108 can have a variety of shapes, colors, and sizes. In FIG. 1a, various shades and patterns are shown. A variety of colors can also be used. Shapes shown in FIG. 1a include squares 103, letters 104, hexagons 105, rectangles 106, triangles 107, and circle 108. Other shapes including other polygons, ovals, numbers, characters, symbols, and figures can be used. The light emitting apparatus 100 can be a configurable system. For example, the plurality of EL devices can be selected such that the apparatus 100 emits light with predetermined color characteristics. For example, by selectively mixing EL devices of different colors, the light output from the apparatus 100 can be substantially white. The light output from the apparatus 100 can be tunable based on user preferences. In addition, the EL devices 103-108 can be selected to form a pattern on the system substrate 102.

In one embodiment, at least some of the EL devices emit light of different colors, and the colors are selected from, for example, red, green, blue, or white. At least some of the EL devices can be removably coupled to the system substrate, and the system can be expandable to have more EL devices "plugged in." Thus, the color of the output light from the apparatus, which is a mix of those of individual EL devices, can be changeable by selectively replacing at least a subset of EL devices. The light emitting apparatus can further comprise a homogenizer to detract from the pixilated appearance of the emitted light.

The pattern formed on the system substrate can also be changeable by selectively placing EL devices. The system substrate can be configured to receive at least one EL device at a non-discrete location or orientation. At least one EL device can be positioned at almost any location on the system substrate. There is a large degree of freedom in at least one of lateral positioning or rotational positioning of the EL device. In some embodiments, the EL device can be positioned anywhere along x and y tracks. In another embodiment, the EL device can be positioned at any rotational angle. In yet another embodiment, the EL device can be placed anywhere on the system substrate coupling surface in the manner of a push pin EL device and a bulletin board system substrate, or a magnetic EL device and a magnetic board system substrate. This non-discrete positioning of the EL devices allows for a multitude of patterns to be formed and the user can configure the EL devices into a light mosaic.

EL Device

Example EL devices 103-108 are illustrated in FIG. 1a as part of a light emitting apparatus 100. The EL device can be an OLED, a thin TFEL device, a powder electroluminescent device, or an inorganic LED device. FIG. 1b shows a cross-sectional view of an EL device. The EL devices each comprise an active (light-emitting) region 113 sandwiched between two electrodes 114 and 116, one of which 116 is transparent to the generated light 118. Generally, this sandwich configuration is disposed on an EL device substrate which can be a glass, a plastic, or a metal foil, for instance. In some embodiments, both electrodes and EL device substrate are substantially transparent, allowing for light output in both directions. In this case, the EL device can itself be substantially transparent. A transparent material selected from a conductive oxide, a metal thin film, or an organic thin film can be used for the transparent electrodes. Indium titanium oxide (ITO) can be used as a transparent electrode. Light 118 is generated when an appropriate voltage is applied using a voltage source 120 across the two electrodes 114, 116.

In OLED configurations, the two electrodes comprise a cathode and an anode, and the active region comprises an organic material. The organic material can include a small molecule material or a polymer material, and is electrically coupled to the anode and cathode. A transparent anode can be disposed on a transparent substrate, and the active region and cathode can be disposed on the anode. Light emission can be through the transparent anode and substrate. Alternatively, the device can have an inverted structure in which a cathode is disposed on the substrate, and the active region and anode are on top. In this case, the cathode and the substrate can be transparent, and light can be bottom emitting. In some other embodiments, the device can be top-emitting through a transparent anode on top of the active region.

Using OLED devices as the EL devices can take advantage of the planar nature and high light output of OLED devices. On the other hand, the EL devices can also include HFELs. Most commercially available powder or thin film EL displays use inorganic phosphors. Alternating current EL products generally use ZnS-based phosphors doped with a small amount of manganese. In a thin film EL device, a phosphor layer is insulated between two dielectric layers that limit current to a level that only allows capacitive charging and discharging. Sandwiching this structure can be perpendicular electrodes, one of which can be transparent. When an AC drive voltage is applied, high-energy electrons are injected into the phosphor, resulting in illumination of the phosphor. DC EL devices use pulsed currents to create light emission from a phosphor layer. Powder EL is similar to thin film EL, but the phosphor is generally deposited from slurry formed from a phosphor powder combined with a liquid agent.

In one embodiment, a planar, area emitting EL device with a light emitting surface area of >5 mm$^2$ can be used. In some embodiments, "point source" emitters such as conventional LEDs, and non-planar EL devices can also be used. Conventional LEDs can also be used with light diffusers to make area emitting planar EL devices.

The active region can be very large, e.g., on the order of 1 m$^2$ or larger. The size can be limited by manufacturing processes. The active region preferably has a light emitting area of at least 0.5 cm$^2$. Devices of this size can be useful, for example, in forming detailed regions of mosaics with a reduced pixilated appearance. In one embodiment, the light emitting area can be at least 2 cm$^2$. EL devices of this size can be useful, for example, in games, novelty devices, night lights, and lamps. In another embodiment, the light emitting area can be at least 10 cm$^2$. EL devices of this size can be useful, for example, in general illumination lighting applications or on building or billboard displays.

Embodiments disclosed herein, including the coupling and driving mechanisms disclosed herein, can also be applicable to sensors, photovoltaic devices, and other light emitting devices.

Active Region

EL devices each have at least one active region. The active region refers generally to the region where electrons and holes recombine to radiate photons. In OLEDs, the active region comprises an organic material, and the radiative photon energy can correspond to the energy difference between the lowest unoccupied molecular orbital (LUMO) level and the highest occupied molecular orbital (HOMO) level of the organic material. Photons of lower energy/longer wavelength can be generated by higher-energy photons through fluorescent or phosphorescent processes.

The organic material in the active region can be an electroluminescent polymer. The polymer can be a fluorescent emitter, or a phosphorescent emitter. The polymer can include, for example, poly-phenylene vinylene, or polyfluorene. The polymers can be engineered to substitute side chains onto the backbone to tune the color or to improve the processing of the polymers. Alternative to a polymer emitter, a small molecule emitter comprising for example, organometallic chelates or conjugated dendrimers, can be used.

The EL device can have a continuous region forming a single light emitter. Alternatively, the active region can comprise a plurality of discrete light emitters forming a plurality of pixels. The individual pixels can be collectively driven, e.g., through a common anode and a common cathode, and thus illuminate all together. Alternatively, these pixels can be individually driven through their own anodes and cathodes. In the latter case, multiple electrical paths may be needed and a control module can be used to individually or collectively control the pixels. The pixels can be of the same color, or they can emit light of different colors.

In some embodiments, an EL device can have an active region comprising a plurality of vertically-stacked light emitting layers. These layers can be configured to emit light of different colors. In addition, the plurality of vertically-stacked light emitting layers can be interlaced with substantially transparent non-emitting layers which can serve as electrodes, allowing the individual layers to be independently controlled by a control module or multiple power supplies. The layers can also be electrically coupled in series to a single power supply. The power supply can comprise a battery, an adapter, or can be part of a power grid. The EL devices can be powered by alternating current or direct current.

In thin film EL devices, a high electric field on the order of $10^6$ V/cm is applied to the EL materials. Electrons are injected into the EL emitting layers. These electrons are accelerated by the electric field until some of them reach energies sufficient to cause impact excitation of luminescent centers generating EL light. The most common luminescent centers in ZnS and other EL hosts are $Mn^{2+}$ and the rare-earth ions; these activators offer a wide variety of emission colors.

In the case of powder phosphor EL, electrons and holes are injected by tunnel emission (field emission) induced by high electric field (~$10^6$ V/cm) applied to a conductor-phosphor interface. The excitation mechanism is similar to that of TFEL. The active region can comprise an inorganic phosphor.

The active region can be manufactured by known methods including, for example, spin coating, drop casting, vapor deposition or sputtering, crystalline growth, patterned etching, dip coating, or by printing techniques such as ink jet printing, silk screen printing, off-setting, transfer processes, or by spray applications.

Coupling Members

The EL device can have at least one coupling member configured to couple the EL device electrically and/or mechanically to a system substrate. Alternatively, or additionally, the system substrate can comprise at least one coupling member configured to couple the EL device mechanically or electrically to the system substrate. The coupling member can be a mechanical coupling member, or it can be an electrical coupling member, used to electrically couple at least one electrode to a power supply via the system substrate. Coupling members can be selected from, for example, a hook-and-loop connector, a beaded stem fastener, an adhesive, a putty, a tape, a push pin, a staple, a clip, a plug, or a magnet.

In some embodiments, the coupling member is an electromechanical coupling member used for both electrical coupling and mechanical coupling. The electromechanical coupling member can be in the form of a conductive hook-and-loop connector, a conductive beaded stem fastener, a conductive magnet, a push pin with a conductive post, a conductive adhesive, a conductive putty, or a conductive tape.

In some embodiments, the EL device has a coupling member and the system substrate comprises a complementary coupling member or vice versa. In these embodiments, when one of the coupling members is a tape, adhesive, or putty, the complementary coupling member is a surface to which the tape, adhesive or putty will adhere. Likewise, when one of the coupling members is a push pin, staple, plug or clip, the complementary coupling member is a member to which the push pin, staple, plug, or clip can be coupled.

In some embodiments, the EL device must be properly paired to the system substrate with respect to electrical polarity (+/−) in order that a diode behavior of the device provides luminescence. Complementary coupling members can be arranged on the system substrate and EL devices to ensure a proper electrical polarity. For example, the system substrate may comprise two coupling members of opposite mechanical types, such as hook elements of a hook-and-loop connector connected to the positive conductive path, and loop elements connected to the negative conductive path. The EL device electrode connecting to the positive conductive path can have a loop element and the EL device electrode connecting to the negative conductive path can have a hook element. Thus, the EL device electrodes are forced to mate with the correct conductive paths of the system substrate. Similar coupling member arrangements can be made using beaded stem fasteners and magnets. When magnets are used in the system substrate and EL device, the polarity of the magnets is arranged to force proper mating.

Encapsulation

The EL device also can have an encapsulation that isolates the active region from an ambient environment. In particular, the encapsulation helps prevent water vapor and oxygen from interacting with any organic material in the active region. The encapsulation can also provide physical protection to the EL device. With the coupling members and the encapsulation, the EL device can be readily used as a standalone device, or can be placed into a lighting system to replace another device. In addition, the EL device can be in the form of a chip as described in U.S. Provisional Patent Application Ser. No. 61/090,150, "Organic Light Emitting Diode Lighting Devices" filed Aug. 19, 2008.

Other EL Device Features

The EL device can include additional layers such as charge injection, transfer, and blocking layers to help balance charge injection and improve the light emitting efficiency. The EL device can also have an improved light emitting efficiency by improving the light out-coupling efficiency through engineering the optics. In some embodiments, the EL device includes a light out-coupling member configured to improve light out-coupling efficiency by redirecting trapped light out of the EL device and EL device substrate. The light out-coupling member can comprise a reflective layer, a lens, a microlens array, a low-index layer, a low index-grid, a photonic crystal, or a roughened or patterned surface or interface. In some embodiments, the light out-coupling member is also configured to convert the spectrum emitted by the active region to another spectrum of a longer wavelength. For example, the light out-coupling member can comprise a phosphor layer, or a quantum-dot-based film. The phosphor layer or the quantum-dot-based film can be configured for down-converting photons of higher energy to lower energy.

The EL devices can be area emitting EL devices with various colors, sizes, and shapes. Also, the EL devices can be flexible, conformable, or rigid. In one exemplary embodiment, a plurality of EL devices of a variety of shapes and colors are supplied in a kit such that a light mosaic can be formed by a user aided with instructions provided in the kit. The EL devices can, for example, have substantially polygonal shapes (such as hexagonal, pentagonal, triangle, rectangle, square, or octagonal) or character shapes (such as numbers, letters, or symbols). The shape can form a company logo or symbol. Alternatively, the shapes can be configured to combine to form a logo or symbol. These shapes can also be holiday shapes that correspond to a holiday or special occasion theme. For example, lights in the shape of Christmas trees, stars, candy canes, and reindeer are Christmas holiday shapes, hearts are associated with Valentine's Day, shamrocks are associated with St. Patrick's Day, etc. Other shapes can also be used. The plurality of EL devices can be mechanically and electrically coupled to the system substrate. The location of the EL devices on the system substrate can be selected such that a pattern is formed by the EL devices.

In one embodiment, rather than having a light emitting surface in the form of a desired shape or character, the EL device comprises a covering that blocks light. The blocked light forms the desired shape. This can be achieved, for example, by printing an opaque or translucent ink on the EL device surface. Alternatively, the EL device can comprise a cover that blocks some of the emitted light such that a shape is formed from the unblocked region on the light emitting surface. For example, an EL device with a square shape can be printed with an opaque ink such that a light emitting region in the form of the desired shape is formed.

In addition to emitting light that defines various shapes, the EL devices can have different emission wavelengths. The EL device can be coated with a color or labeled with a symbol indicative of a light emission color of the active region, for example, red, green, blue, or white. EL devices can produce light in the visible range (380 to 700 nm), the ultraviolet range (UVA: 315 to 400 nm; UVB: 280 to 315 nm), and/or the near infrared range (700 to 1000 nm). Visible light corresponds to a wavelength range of approximately 380 to 700 nm and is usually described as a color range of violet through red. The human eye is not capable of seeing radiation with wavelengths substantially outside this visible spectrum such as in the ultraviolet or infrared range, but these wavelengths can be useful for applications other than lighting, such as phototherapy applications. The visible spectrum from shortest to longest wavelength is generally described as violet (approximately 400 to 450 nm), blue (approximately 450 to 490 nm), green (approximately 490 to 560 nm), yellow (approximately 560 to 590 nm), orange (approximately 590 to 630 nm), and red (approximately 630 to 700 nm). Ultraviolet radiation has a shorter wavelength than the visible violet light and infrared radiation has a longer wavelength than visible red light. White light is a mixture of the colors of the visible spectrum. By appropriately mixing different EL devices, the output spectrum can be visually substantially white.

There are multiple methods of producing white light using EL devices. For example, one method is to use individual EL devices that emit visible light in the red, the green, and the blue wavelength ranges. The EL devices can be in a single layer or in a layered structure. White light can also be produced by preparing an EL device comprising a phosphor material capable of converting monochromatic light from a blue or UV EL device to broad-spectrum white light or by converting just a portion of the blue light with a yellow emitting phosphor material.

By selecting a plurality of EL devices, a lighting system can be assembled with a desired color, pattern, area, and brightness.

System Substrate

The system substrate can be the frame or mount upon which the light emitting apparatus can be built. In addition to mechanical support, the system substrate can also provide conductive paths for electrically coupling the EL devices to a control module or power supply.

In some embodiments, the system substrate comprises an addressable array of conductive paths to allow individual addressing of EL devices. In other embodiments, the system substrate comprises a plurality of designated conductive paths, each configured to supply a different drive condition to EL devices connected to it. The EL devices are configured to electrically couple to selected conductive paths of the system substrate, generally depending upon the emission wavelength of the EL device.

The system substrate can be flat or curved, flexible, rigid, or conformable. The system substrate, for instance, can be curved outward to aid in the projection of light, or curved inward to concentrate the light. The system substrate can be substantially transparent to light generated by the EL devices. The system substrate can have electrical and/or mechanical couplers to allow attachment of additional system substrates. In one embodiment, a plurality of system substrates can be coupled in a modular fashion. For example, system substrates can be connected to form a cube.

The system substrate can be configured to be mounted on a surface, such as a wall or ceiling, or it can be configured to be free-standing. The system substrate can be configured to be mounted on a variety of other surfaces including clothing, cars, buildings, and shelves. The system substrate can be a three-dimensional system substrate. For example, the system substrate can be in the shape of a sphere, a cylinder, or a lamp shade. The system substrate can be configured to be mounted on a decorative base. As an example, a decorative night light can be made comprising a butterfly base. The system substrate can be mounted on the butterfly wings and the user can assemble decorative patterns with EL devices of various shapes and colors on the night light light-emitting apparatus.

The system substrate can be a substantially planar substrate with an area larger than the emissive area of the EL devices. In one embodiment, the area of the system substrate can be larger than the area of the EL device by about one order of magnitude or more.

The system substrate can comprise light out-coupling members such as reflectors, to aid in the extraction or directionalization of the light. The system substrate can be transparent, opaque or translucent. It can be flexible, rigid, or conformable.

Drive Conditions

Light emitting apparatuses can have different types of electrical coupling. For example, a first type of electrical coupling allows for all EL devices to share a common positive and a separate but common negative electrode and be driven at a common voltage or drive condition. In this system, all EL devices coupled to the system substrate are driven in the same manner. This would work well for a system where the EL devices are of one color or where EL devices of various colors are designed to operate well at the desired voltage. For instance, a voltage controller can be paired with each EL device according to its color to enable a common drive voltage for all devices. Alternatively, individual EL devices can be designed to operate well at a common voltage by tailoring emissive area, thickness, or resistance.

A second type of electrical coupling allows for multiple driving conductive paths to be used. In this instance, each EL device can be electrically connected to a first conductive path in the system substrate that acts as a common ground connection. The additional EL electrode couples to an additional conductive path in the system substrate. There can be two, three, four or more additional conductive paths in the system substrate to provide two, three, four, or more driving conditions to EL devices. All EL devices of a certain color (or desired drive conditions) can be connected to the desired additional conductive path and driven the same. For instance, all red EL devices connected to a first additional conductive path can be driven at voltage V1; all green EL devices connected to a second conductive path can be driven at a voltage V2; and all blue EL devices connected to a third conductive path can be driven at a voltage V3.

Different colors and sizes of EL devices can be driven using a control module to achieve a desired intensity or color characteristic. The desired color characteristic may be one of a desired spectral power distribution, correlated color temperature, or color rendering index, for example. The desired intensity may be a desired luminance or desired far-field intensity. The control module can also be configured to drive the EL devices such that they can flash or can be activated in a pattern. Furthermore, the feedback mechanism and wear leveling mechanisms discussed in U.S. Provisional Patent Application Ser. No. 61/102,330, "ORGANIC LIGHT EMITTING DIODE LUMINAIRES" filed Oct. 2, 2006, and U.S. Provisional Patent Application Ser. No. 61/102,326, "ORGANIC LIGHT EMITTING DIODE LIGHTING SYSTEMS" filed on Oct. 2, 2008, can be used here.

A third type of electrical coupling can be where each EL device is individually addressed. In this case, all EL devices can share a common ground conductive path but each EL device makes contact with a unique additional conductive path so that the control module can address and drive the EL device individually.

Apparatuses with any of the three types of electrical coupling can have a control module. The control module can be connected to the light emitting apparatus to vary the drive condition supplied to the EL devices. The control module can be configured to cause the EL device to flash, or the control module may be configured to change the intensity of the light output of the apparatus. The control module can be configured to vary the drive condition based on a time, a feedback from a sensor, or a user input into an electronic interface, for instance. The control module may receive inputs from the electronic interface, sensor, or other device through wired or wireless communication. In apparatuses with multiple drive conditions or addressable devices, the control module may provide further control of the light output of the lighting system, and enable features such as tuning a color characteristic of the apparatus light output.

Embodiments Using a Common Drive Voltage

As described above, mechanical coupling members used to couple the EL devices to the system substrate can include hook-and-loop connectors, beaded stem fasteners, adhesives, putty, tape, push pins, or magnets. The mechanical coupling means can also serve as electrical coupling means (conductive hook-and-loop connector or conductive adhesive, for example).

Figure 2:
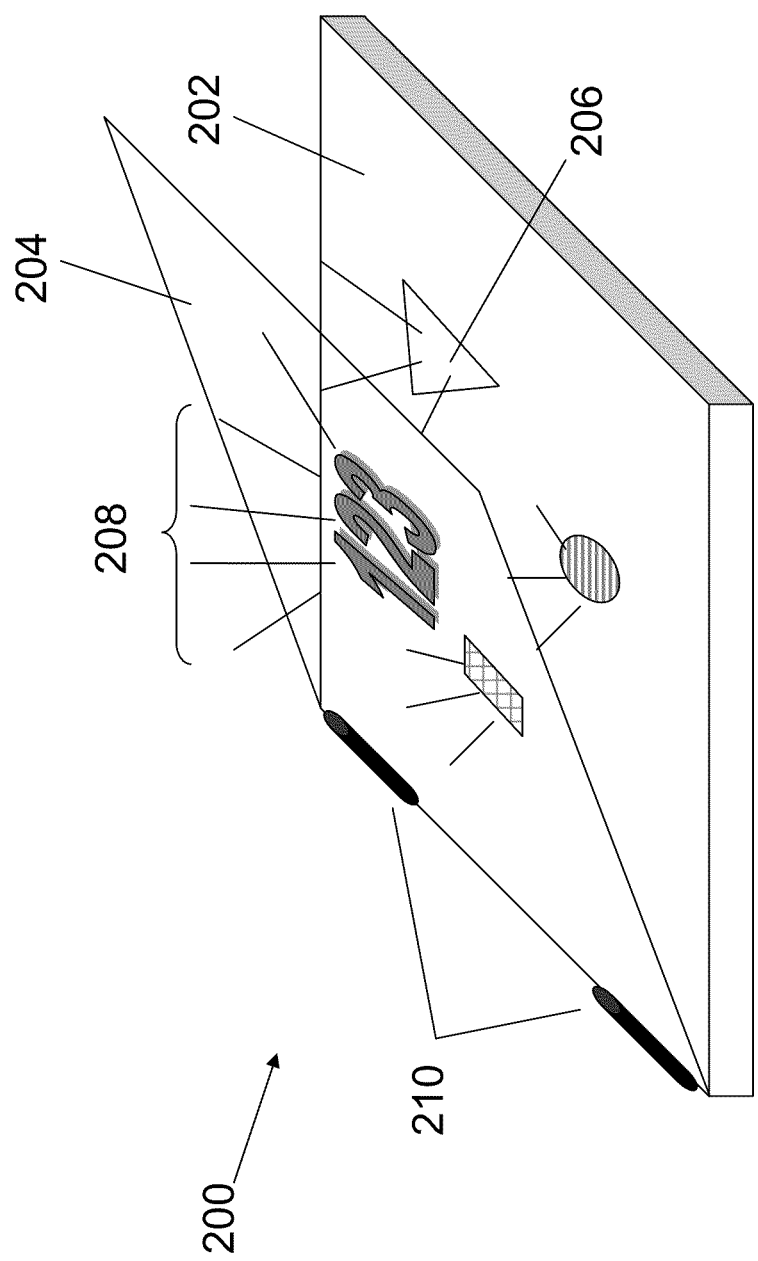
FIG. 2 is a perspective view of an example of a light emitting apparatus wherein EL devices are sandwiched between a system substrate and a transparent cover.

Another coupling scheme involves a system substrate and a cover, at least one of which is transparent. The cover can be configured to provide at least one of a mechanical or an electrical coupling of the EL devices to the system substrate. FIG. 2 illustrates an electro-mechanical "sandwich" embodiment 200, wherein both the system substrate 202 and the cover 204 are conductive. In one embodiment, the system substrate comprises a first conductive path, and the cover comprises a second conductive path. At least one EL device 206 comprises a bottom electrode and a top electrode configured to make contact to the first and second conductive paths, respectively, when sandwiched between the cover 204 and the system substrate 202. At least one of the conductive paths is substantially transparent and can comprise a transparent conductive oxide, poly(3,4-ethylenedioxythiophene) (PEDOT), thin transparent grid, thin metal layer, carbon nanotube, or a nanoparticle thin film. The conductive path can be disposed on a transparent glass or plastic. In the "sandwich" embodiment 200 shown in FIG. 2, the cover 204 can be substantially transparent to the light 208 emitted by the EL devices 206.

The cover 204 can be connected to the system substrate 202 with at least one hinge 210. Alternatively, a clamp, a screw, a magnet, or an adhesive can be used. In one embodiment, the cover 204 can be completely removable from the system substrate 202. The EL devices 206 can be sufficiently thick to prevent the system substrate 202 and cover 204 from making electrical contact with each other. In one embodiment, a separating insulator can be included to provide spacing between the first and second conductive paths so that they do not make electrical contact.

Pressure applied between the system substrate and the cover can serve as mechanical positioning means, especially if one of the cover or the system substrate is mounted on a material such as foam or sponge that is capable of elastic deformation. Alternatively, the EL devices can be electromechanically coupled with a conductive adhesive, a hook-and-loop connector, or magnets. Furthermore, the cover can comprise a homogenizer.

In some embodiments, the cover need not be electrically conductive or comprise a second conductive path. In this case, the second conductive path can be incorporated in the system substrate, and electrically isolated from the first conductive path. Additionally, any of the embodiments described below can further comprise a cover. The cover may or may not supply mechanical coupling of the EL devices to the system substrate.

This embodiment allows for positioning freedom of the EL device. The EL device can be rotated in the plane of the system substrate and can be positioned anywhere that permits electrical connection of the EL device electrodes with the first and second conductive paths. In some embodiments, this can be anywhere on, or even extending beyond, the system substrate.

Common Contacts/Grid or Array

In some embodiments, the system substrate comprises a first conductive path on the surface of the system substrate, such as a common conductive back plane, and a second conductive path formed from a conductive grid or array (such as a line or checkered array). Both the first and second conductive paths are configured to make electrical contact with the at least one EL device. The conductive grid or array is electrically insulated from the first conductive path and can be recessed into the system substrate, in the plane of the system substrate surface, or extending from the system substrate. Optionally, at least one of the first or second conductive paths can also provide mechanical coupling of the EL device. For instance, the grid or array or a common back plane can comprise an electromechanical coupling member such as a conductive hook-and-loop connector.

EL devices compatible with conductive grid or array embodiments can have a first electrode on the bottom surface of the EL device, and an additional electrode, which can, for example, protrude from the bottom of the EL device. Alternatively, the first electrode can protrude from the EL device and the additional electrode can be on the surface of the EL device. When both the first conductive path and the conductive grid or array are in the plane of the system substrate, both the first and additional electrodes can protrude from the EL device. Other configurations are also possible.

FIG. 3a shows a cross-sectional view and FIG. 3b shows a top plan view of a light emitting apparatus 300. The light emitting apparatus 300 supplies a common drive condition for all EL devices 302 coupled to the substrate. The various patterns of the EL devices in FIG. 3 represent various light emission wavelengths for the EL devices.

The EL devices can make contact with a common first conductive path on the system substrate, which can be a conductive back plane, and an additional common conductive path which can be a conductive grid. The first conductive path of the system substrate 304 is a common back plane 306. The additional common conductive path in this embodiment comprises the conductive grid 305. In this embodiment an electromechanical coupling member, such as a conductive hook-and-loop connector, can be employed to mechanically couple the EL devices to the system substrate. The back of the EL device 302 has a first electrode 308 including a small, complementary electromechanical coupling member such as a conductive hook-and-loop connector that mates with the hook-and-loop connector of the back plane 306. This first electrode 308 protrudes from the EL device 302 and connects the EL device 302 electrically and mechanically to the system substrate back plane 306.

The back of the EL device 302 has an additional, large-area electrode 310 configured to make electrical contact to an additional conductive path on the system substrate. The additional electrode 310 is electrically insulated from the first electrode 308 of the EL device 302. The additional conductive path can be a grid 320 that extends from the system substrate surface and is electrically isolated from the first conductive path (the common back plane) 306 by an insulating layer 322. The additional electrode and conductive path can also provide mechanical coupling of the EL device to the system substrate 304 and can be in the form of a connecting conductive hook-and-loop connector, a conductive adhesive, or a conductive magnet.

In another embodiment, only one of the first conductive path or the conductive grid or array provides mechanical coupling. For example, the conductive grid or array can comprise an electromechanical coupling member configured to mechanically couple the EL device to the system substrate and electrically connect the grid or array to the additional electrode of the EL device. The first conductive path of the system substrate can be configured to provide only electrical coupling to the EL device in this case.

In the above embodiment, the first electrode 308 of the EL device 302, which comprises a small electro-mechanical coupling member, can be positioned anywhere on the system substrate back plane 306 that is not blocked by the grid 320, allowing a large degree of freedom in positioning the EL device 302. The EL device 302 can be rotated in the plane of the system substrate and can be moved about in non-discrete positions in lateral dimensions in the system substrate plane. The small electro-mechanical coupling member can be positioned off-center to increase positioning freedom. In some embodiments, the EL device dimensions can be greater than the dimensions of the grid, and the area of the protruding first electrode can be less than half the area of the open spaces defined by the grid 320. When both the grid 320 and the back plane 306 permit mechanical coupling, more stability in the EL device position can be obtained.

Post

Another embodiment in which all EL devices share a common drive voltage is where a "push pin" or "post" coupling mechanism is used. The post can be a straight pin probe with a pointed or dull tip, or it can be in the shape of a corkscrew. The post can be mounted on the back of the EL device. It can also be removable from the EL device. In the post embodiments, a "bulletin board" of cork, foam or other types of materials that are penetrable by the post can be used. Such a board can provide mechanical support for the post. In these embodiments, the "push pin" or "post" EL devices work in conjunction with the system substrate "bulletin board" to allow non-discrete freedom of positioning the EL devices at almost any rotational and translational position on the system substrate.

FIG. 4a is a cross-sectional view of a "push pin" light-emitting apparatus 400 operating with common drive conditions for all EL devices. The system substrate can have a first conductive path and an additional conductive path in the form of conductive layers. EL devices of different colors can be connected to the conductive paths through electrodes on the back surface of the EL devices and post electrodes. In the embodiment shown in FIG. 4a, the system substrate 410 comprises a first conductive path 412, which is a conductive layer on the top surface 413 opposite the bottom surface 414 of the system substrate. The system substrate 410 further comprises an additional conductive path, which is a buried conductive layer 416. The first and additional conductive paths 412, 416 are separated by an insulator 420, which can comprise a cork or foam material. The first conductive path 412 can be a replaceable component that can be removed from the system substrate 410. For example, it can be a replaceable metal foil sheet. Additional layers, such as the insulator 420, can also be replaceable. The first conductive path 412 need not be a continuous layer. In one embodiment, the first conductive path 412 comprises a conductive grid on the surface of the bulletin board.

EL devices 430 are electrically coupled to the system substrate by making contact to the first conductive path 412 and additional conductive paths 416. FIGS. 4b and 4c show example cross sections of EL devices. The back surface electrode can be configured to make contact to a common conductive path on the top surface of the system substrate. The first electrode can be configured to make electrical contact to a common conductive path located on or beneath the top surface of the system substrate.

In FIGS. 4b and 4c, each EL device 430 has a first electrode 432 on the back surface of the EL device and an additional electrode 434 on the post 435. The electrodes 432 and 434 are electrically isolated from one another by physical separation or by an insulator, such as an insulating sheath 436 adjacent the base of the post as shown in FIGS. 4b and 4c. When the post 435 is inserted into the system substrate, the first electrode 432 of the EL device 430 makes electrical contact with the first conductive path 412 and the additional electrode 434 of the EL device 430 makes electrical contact to the additional conductive path 416. The post can penetrate or touch the surface of the additional conductive path 416. Thus, the post 435 provides electrical coupling of the EL device 430 to the system substrate 410.

In an alternative embodiment, both conductive paths of the system substrate can be buried within the system substrate to provide contact at certain points along the post. In other words, the first conductive path of the system substrate need not be on the top surface of the system substrate. In this case, the EL device can comprise multiple posts each configured to make electrical contact to one of the conductive paths of the system substrate, or the EL device can have one post with multiple electrodes, electrically isolated from one another, such as in FIG. 4c. Using the EL device of FIG. 4c, the first electrode can penetrate the top surface of the system substrate allowing for the first conductive path to be buried within the system substrate. In this case, each electrode is electrically exposed at a location along the length of the post at a distance corresponding to the depth of a buried conductive path below the top surface of the system substrate.

In some embodiments, mechanical coupling of the EL device with the system substrate is provided by the insertion of the post into the system substrate board, much like a push pin or tack is used to mechanically couple to a bulletin board. In other embodiments, the post does not provide substantial mechanical coupling. For instance, when large area emitting EL devices are used, the size and weight of the EL devices may be such that the post or pin provides minimal mechanical coupling. In this case, mechanical coupling can be made with a coupling member such as a hook-and-loop connector, a beaded stem fastener, a magnet, an adhesive, putty, tape, staple, or cover. Such mechanical coupling members can also comprise a conductive element to provide an electrical connection between the EL device and the system substrate.

Embodiments Using Multiple Drive Conditions

The "push pin" or post embodiments can be adapted to allow for different groups of EL devices (different colors, for instance) to be operated at different voltages. In one embodiment, the EL devices have posts having a length corresponding to the depth of the desired conductive layer or path within the system substrate. Each conductive path can be configured to supply a different drive condition to the EL devices coupled thereto. As illustrated in cross-sectional view in FIG. 5a, a light emitting apparatus 500 can have multiple conductive paths (such as layers) 510, 512, 514, 516 buried within the system substrate 520. There are EL devices 530, 531, 532 that emit light of various colors, indicated by the patterning or hatching of the EL device. Device 530 is, for example, a red light emitting EL device. Device 531 can be a green light emitting EL device, and device 532 can be a blue light emitting device. The EL devices 530-532 each have a first electrode 540 configured to make electrical contact with the first conductive path 510. The first conductive path 510 can, for example, be a conductive thin film, a metal foil, or a grid.

The EL devices 530-532 also can each have a post comprising an additional electrode 550 configured to make contact to one of the additional conductive paths 512, 514, 516 of the system substrate. In this example, the first conductive path 510 is a common ground. The driving conditions of the EL devices 530-532 are determined by the additional conductive path they are coupled to. Thus, the length of the EL device post is tailored to correspond to the depth of the desired conductive path. For instance, the red EL device 530 has a short post to make contact with the first additional conductive path 512. The green EL device 531 has a longer post, the length of which is tailored to correspond to the depth of the second additional conductive path 514. The blue EL device can have the longest post, with a length corresponding to the depth of the third additional conductive path 516. In this manner, the red EL devices, which may require the lowest operating voltages supplied by the first additional conductive path 512, will be additionally protected from contacting the second conductive path 514 or the third conductive path 516 which supply increasingly larger drive voltages.

The additional electrode 550 of the EL device 530-532 can be insulated from the first electrode 540 of the EL device by an insulating sheath 560. This insulating sheath 560 can extend the length of the post until the depth of the desired additional conductive path is reached. Thus, the additional electrode would be electrically insulated from all additional conductive paths that it penetrates before reaching the desired additional conductive path.

FIG. 5b is an enlarged cross-sectional view of an EL device with a first electrode 540, a post comprising an additional electrode 550, an insulating sheath 560, and a light emitting surface 570. The EL device has a back surface electrode configured to couple to a common first conductive path on the surface of the system substrate and a conductive post long enough to penetrate the desired additional conductive path below the system substrate surface. The post is insulated with an insulating sheath to prevent contact with undesired penetrated conductive paths.

The number of additional conductive paths or post lengths is not limited to three. More than one EL device can be electrically coupled to any of the additional conductive paths. The first conductive path or common ground path can also be buried. This would eliminate the need for a grid or foil cover on the top surface of the system substrate.

In another embodiment, multiple posts of different lengths on a single EL device can be used to make contact to the various conductive paths. For instance, one long post can comprise a first electrode to make contact with a first conductive path which is a common contact back plane of the system substrate. A shorter post on the EL device can have a length of a certain depth to electrically connect an additional electrode to one of the designated red, green or blue additional conductive paths. Alternative to having the post physically attached to the back of the EL device, the post could be a separate fastener that pierces through a prefabricated hole in the EL device. In this case, electrical contact could alternatively be made from the top side of the EL device to the post fastener.

In some embodiments, a single post can comprise a first electrode and at least one additional electrode. The electrodes would be electrically isolated from one another by an insulator within the post. The post can have electrical connectors for each electrode configured to provide electrical coupling between the electrodes and the conductive paths of the system substrate at the appropriate positions. The post can have insulations such that each electrode electrically couples to one of the conductive paths of the system substrate.

The push pin devices described above can be used with a control module configured to selectively activate EL devices by supplying electrical current to the selected conductive paths. For example, only EL devices making contact to one of the additional conductive paths can be activated. As another example, the drive conditions supplied to the various conductive paths can be configured such that the output light of the apparatus is substantially white. The control module can provide various drive conditions to the various conductive paths based on feedback from a sensor.

Grids or Arrays

In some embodiments, different conductive paths to supply different drive conditions (which can be adapted for a single drive voltage as well) are provided by a system substrate that comprises recessed tracks forming multiple conductive grids or arrays. FIGS. 6a and 6b illustrate a light emitting apparatus 600 with multiple recessed tracks/grids in the system substrate. FIG. 6a is a top plan view of the system substrate 620. FIG. 6b is a cross-sectional view of the EL device 630, and FIG. 6c is a cross-sectional view of a portion of the light emitting apparatus 600.

The EL device has a first back surface electrode and an additional, protruding electrode configured to fit into one of the recessed conductive grid tracks. The EL device can be coupled mechanically and electrically to the top surface of the system substrate and one of the recessed conductive grid tracks. The conductive grids 612, 614, 616 are recessed and laterally spaced on the system substrate 620.

Figure 8A:
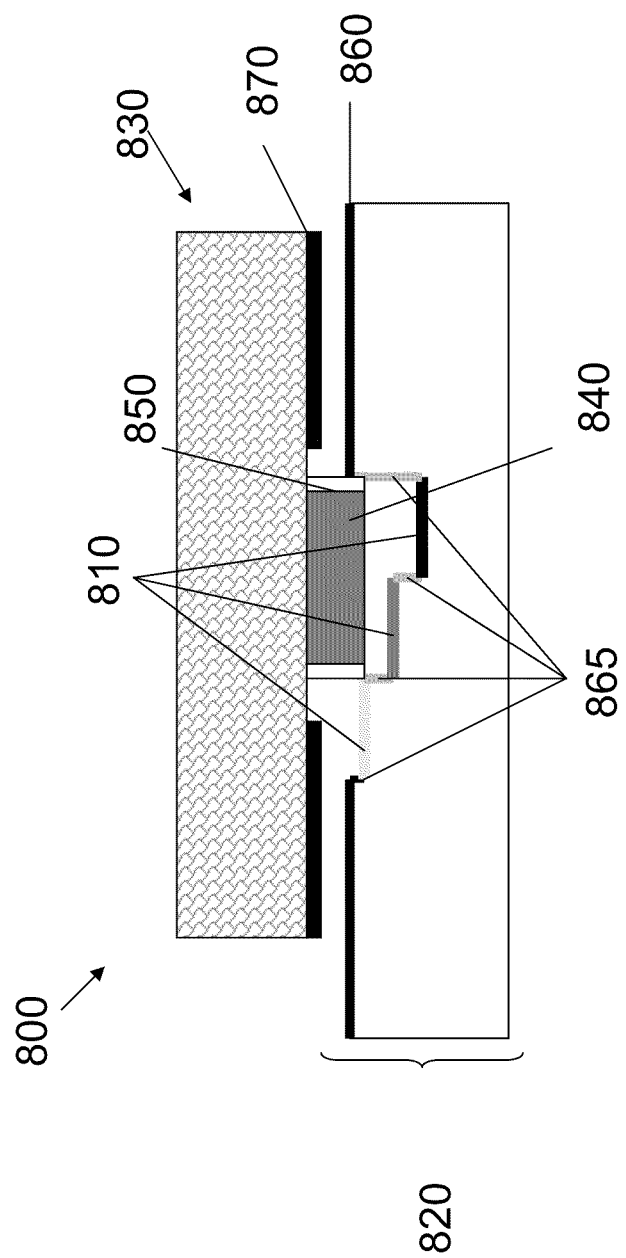
FIG. 8a is a cross-sectional view of a light emitting apparatus wherein an EL device is coupled to a system substrate comprising multiple conductive recessed grids that are vertically and laterally displaced.

The grids can also be vertically spaced as shown in FIG. 8a, 8b. To electrically isolate the multiple tracks 612, 614, 616 from each other, the system substrate 620 can have electrical vias connecting the disjointed sections of the grid.

The top surface of the system substrate can comprise a first conductive path which is a common ground 625 with vias in the system substrate 620 to connect the disjointed regions of the common ground. This first conductive path 625 is configured to electrically couple with a first electrode 627 on the back surface of the EL device 630.

In this example, the grid 612 is a first additional conductive path that supplies a voltage V1 configured to drive one type of EL devices. Optionally, V1 would be the lowest voltage required by the apparatus such as that required by red-color EL devices. The grid 614 is a second additional conductive path configured to supply a voltage V2, for example to drive green EL devices. The grid 616 is a third additional conductive path configured to supply a voltage V3, for example to drive blue EL devices.

EL devices compatible with this apparatus can have a protruding electrode with width and height dimensions that correspond to the width and depth, respectively, of the desired recessed grid. For example, the green emitting EL device 630 has a protruding electrode 640 with a width and height corresponding to the width and depth, respectively, of recessed grid 614. The protruding electrode 640 is configured to electrically couple the EL device 630 to the system substrate 620. The red EL devices, which usually require the lowest operating voltage, can have protruding electrodes with the largest width dimension so that they are not accidentally electrically coupled to a grid supplying a higher operating voltage which may damage the device. The apparatus can comprise a control module to selectively drive the various grids.

The EL device 630 can be moved along the grid, with its protruding electrode in the track, for a large degree of positioning freedom. Optionally, the EL device 630 can be rotated about the axis of the protruding electrode 640. In this case, the protruding electrode 640 can be cylindrical. The area of the light emitting surface of the EL device can be large compared to the area defined by the grid to further promote positioning freedom. The vertically extending sides of the protruding electrode can be coated with an insulator such that the sides of the protruding electrode do not make electrical contact with the first conductive path on the top surface of the system substrate.

Any of the conductive grid or array 612, 614, 616, the first conductive path 625, the protruding electrode 640 or the first electrode 627 can comprise an electromechanical coupling member, such that when the EL device is electrically coupled to the system substrate, it is also mechanically coupled to the system substrate. In one exemplary embodiment, the protruding electrode 640 and the conductive grid or array 612-616 comprise a magnetic component. The EL device can be slid in two dimensions along its track and rotated about the axis of its protruding electrode, being coupled mechanically to the system substrate by a magnetic force.

Figure 7B:
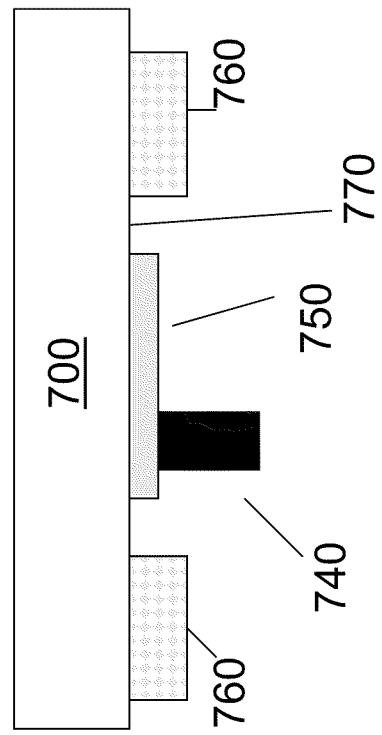
FIG. 7b is a cross-sectional view of the EL device.
Figure 7A:
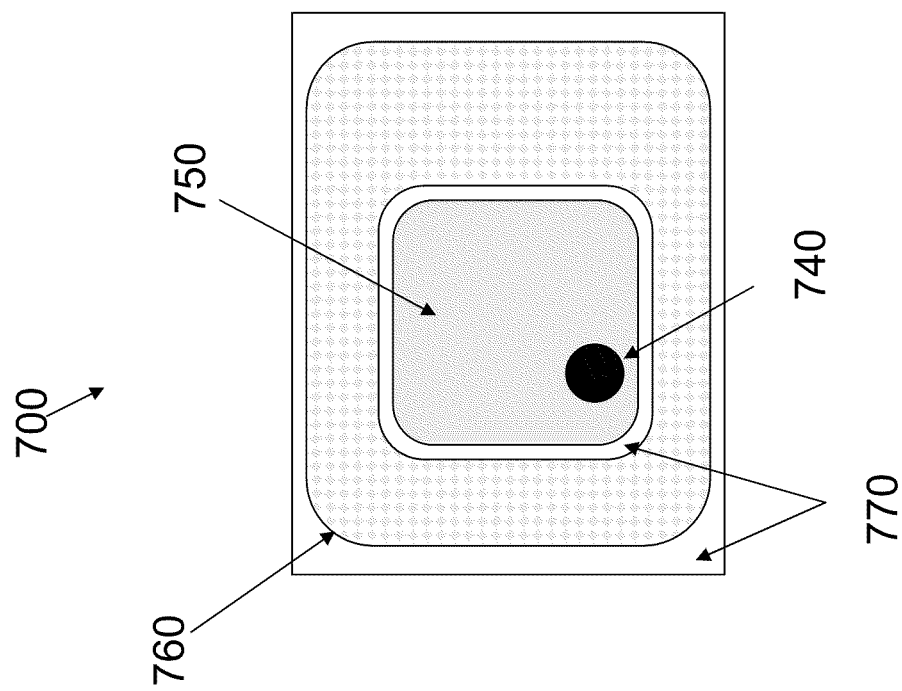
FIG. 7a is a view of the back surface of an EL device.

FIGS. 7a and 7b show a perspective view of the back surface and a cross-sectional view of an EL device 700 compatible with the multiple conductive grid or array embodiments, wherein the protruding electrode is a movable protruding electrode 740. The EL device has a protruding electrode comprising a moveable button magnet, which couples to a magnetic region on the back surface of the EL device. The EL device also has a back surface electrode that is insulated from the conductive magnetic region and the protruding electrode.

In FIGS. 7a and 7b, the moveable protruding electrode 740 comprises a button magnet and the back surface of the EL device 700 comprises a magnetic region 750. Thus, the moveable protruding electrode can be positioned anywhere within the magnetic region. The magnetic region 750 is electrically insulated from the first electrode 760 on the back surface of the EL device by an insulating region 770. Additionally, the first electrode 760 can extend further from the back surface of the EL device (have a greater height than the magnetic region) to prevent the magnetic region 750 from coming into contact with the first conductive path on the top surface of the system substrate. The magnet 740 or the magnetic region 750 can be conductive or can comprise a conductive component (for example, can be coated with a metal) such that when they are mechanically coupled by the magnetic attractive forces, they are also electrically coupled.

FIG. 8a shows a light emitting apparatus 800 wherein the recessed grids/tracks 810 are insulated from each other by positioning them at different depths within the system substrate 820. The EL device 830 has a protruding contact 840 that has a height and width corresponding to the depth and width, respectively, of the appropriate recessed grid 810. The sides of the protruding contact 840 can be insulated with an insulating sheath 850 to prevent electrical coupling of the protruding contact with the first conductive path 860 of the system substrate or the other recessed grids. The EL device 830 also has a first electrode 870 on the back surface configured to electrically connect to the first conductive path 860 on the surface of the system substrate 820. Additionally, there are insulating regions on the vertical sides of the tracks 865.

This embodiment can offer more flexibility in positioning since a finer grid may be allowed because no lateral spacing between the grids is needed. In this embodiment, the system substrate could be fabricated from a plastic in which the stepped recesses are mechanically etched out. Contacts can be deposited on the steps 810 (for vapor deposition, the steps can provide shadowing so that the step edges 865 remain metal free).

EL devices can have protruding electrodes with lengths corresponding to the appropriate track depths. Each track can be driven by different driving conditions. Alternatively, this apparatus can be configured to provide a common voltage to all EL devices. Mechanical coupling of the EL device to the system substrate can be made with mechanical coupling members such as hook-and-loop connectors, beaded stem fasteners, adhesive, or magnets, and the system substrate magnet can be underneath the grooved plastic track or disposed on top.

FIG. 8b shows a cross sectional view of a light emitting apparatus 880 comprising a system substrate 881 with a recessed contact array, rather than a recessed contact grid. The various conductive paths 882, 883, 884 of the system substrate are insulated from each other by positioning them at different depths within the system substrate. The EL device 885 has a protruding contact 886 that has a height and width corresponding to the depth and width, respectively, of the appropriate recessed conductive path. The sides of the protruding contact 886 can be insulated with an insulating sheath 887 to prevent electrical coupling of the protruding contact with the first conductive path 888 of the system substrate 881 or the other recessed conductive paths. The EL device 885 may also have a first electrode 889 on the back surface configured to electrically connect to the first conductive path 888 on the surface of the system substrate 881. Additionally, there are insulating regions on the vertical sides of the tracks.

FIG. 8c shows the system substrate of the light emitting apparatus 880 of FIG. 8b. The system substrate 881 comprises multiple arrays of circular contacts 891. The system substrate may comprise a first conductive path on the system substrate surface and additional conductive paths as buried layers within the system substrate. The contact arrays may be made by removing circular regions of the system substrate to expose the desired conductive path. The contact arrays can be configured to provide different drive conditions as shown in FIG. 8d. Alternatively, this apparatus can be configured to provide a common voltage to all EL devices. In this example, there are three arrays that are vertically displaced. The array 882 of the greatest depth within the system substrate may be used to drive blue devices with a first drive condition 892, for example. The array 883 may be configured to drive green at a second drive condition 893. The array 884, which is closest to the system substrate surface may be configured to drive red EL devices at a third drive condition 894. The apparatus may further comprise a control module 897 connected to the system substrate 881. The control module 897 may be used to vary the drive conditions supplied by the various conductive paths within the system substrate. The control module 897 can be used to selectively drive OLED devices of different colors to different activation levels. The control module 897 may be configured to tune the color and/or the intensity of the light output of the apparatus.

In this embodiment, the EL devices may be rotated 360 degrees about the system substrate receptacle. Mechanical coupling of the EL device to the system substrate can be made with mechanical coupling members such as hook-and-loop connectors, beaded stem fasteners, adhesive, or magnets, and the system substrate magnet can be underneath the grooved plastic track or disposed on top.

Plug

In another embodiment in which the light emitting apparatus has multiple conductive paths to supply different drive conditions to the connected EL devices, plugs and receptacles can be used. FIG. 9a is a perspective view, and FIG. 9b is a cross sectional view of a light emitting apparatus 900 in which the system substrate 910 comprises a mechanical coupling member 920, such as a hook-and-loop connector, a beaded stem fastener, an adhesive, or a magnet. In the case where one mechanical coupling member is an adhesive, a complementary coupling member is any surface that the adhesive may adhere to, for example.

The mechanical coupling member 920 can cover the system substrate surface. The EL device 930, also shown in a cross-sectional view in FIG. 9c, comprises a complementary mechanical coupling member 940 which is positioned on the back surface of the EL device 930. Mechanical coupling of the EL device 930 to the system substrate 910 can be made when the mechanical coupling members 920 and 940 are joined. The plug can comprise a first electrode and additional electrodes. An electrical lead such as a wire or a bundle of wires can be used to attach the plug to the EL device. Electrical coupling of the EL device 930 to the system substrate 910 can be made by connecting at least one plug 950 of the EL device 930 to at least one receptacle 960 of the system substrate 910. In some embodiments, the mechanical coupling members can also comprise a conductor, and can be configured to provide an electrical connection, e.g., a common ground, between the EL device and the system substrate.

When receptacles are used, the "plug" electrodes can have similar configurations as the "push pin" or "post" electrodes in that the electrodes can be electrically exposed along the length of the plug, at locations corresponding to the depth of desired conductive paths in the receptacle. In this case, there can be a plurality of electrodes, electrically isolated from each other within the plug, and a plurality of conductive paths at different depths in the receptacle to allow for different drive conditions for different EL devices.

Another option is to have different receptacles for different drive conditions. In this case, the EL device comprises a plug to fit the corresponding receptacle. The shape of the receptacle can be configured to accept only EL devices with a matching plug. For instance, blue light emitting EL devices can have a plug that is a smaller in diameter than plugs attached to red light emitting EL devices.

The plug can comprise a pin or a plurality of pins. The plug can be a magnetic plug, comprising a magnet to aid in the connection of the EL plug to a complimentary magnetic receptacle. When a magnet is used, the magnetic force allows for easy connecting and alignment of the plug with the receptacle. Furthermore, the plug and receptacle can be connected with one of a spring loaded connector, a magnet, a threaded connector, a snap-in connector, or a pin-and-hole connector. The plug can be removable from the EL device.

A single receptacle on the system substrate can drive the EL device at different voltages depending upon where it makes contact with the plug. For instance, as shown in FIGS. 9a through 10b, a magnetic plug and receptacle can be used wherein concentric rings form separate contacts for red, green, blue EL devices, for instance.

The receptacles can be dispersed on the system substrate and can be recessed into the system substrate so that the EL device is allowed to lie flat on the substrate. The mechanical coupling member (magnet or hook-and-loop connector patches, for instance) can extend from the back of the EL device, thus raising the EL device slightly to permit the electrical leads to run underneath the EL device without causing the surface of the EL device to tilt with respect to the system substrate plane. The insulated wire lead can have a length that permits free positioning of the EL device on the substrate.

FIG. 10a is a schematic of a receptacle 1000. FIG. 10b is a schematic of a plug 1001. The receptacle 100 and plug 1001 comprise magnetic elements 1010, 1050 to aid in alignment and connection of the plug 1001 and receptacle 1000. A common ground path or a first conductive path 1020 is configured to mate to the first electrical connector 1021 of the plug that electrically connects to a first electrical lead 1022 that attaches to the first electrode of the EL device. The additional concentric rings 1030, 1040, 1050 are additional conductive paths configured to supply voltage to drive red, green, and blue EL devices, respectively. These additional conductive paths are electrically isolated from one another with insulating regions 1060. The plug 1001 has a conductive ring 1031 that electrically connects to an additional electrical lead 1032 that attaches to an additional electrode on the EL device. The conductive ring 1031 is electrically isolated from the first electrical lead 1021 with an insulating region 1061.

Rather than concentric conductive rings on a surface, the concentric conductive rings may be vertically displaced, as in FIG. 8b. Furthermore, the plug could be a pin similar to the push pins described above. Furthermore, rather than the recessed receptacle providing both electrical contacts, the mechanical coupling members can be conductive such that they can also provide a common electrical connection between the EL devices and the system substrate.

The apparatus can further comprise a control module to selectively activate EL devices by supplying electrical current to the selected conductive paths. Alternatively, the apparatus can be configured to drive all EL devices with the same drive conditions.

Referring back to FIGS. 9a and 9b, the receptacles 960 are optionally configured into an array on the system substrate. For aesthetic appearances, the receptacles can be covered with a plastic flap that matches the color of the system substrate 920. To permit freedom in positioning, the receptacles 960 can be closely spaced. The EL devices 930 can be configured to rotate about the receptacle position. Additionally, the EL devices can have lateral dimensions greater than or equal to the receptacle spacing 965. In FIG. 9a, freedom of positioning the EL device is greatly enhanced by attaching the plug 950 to the EL device 930 with at least one insulated electrical lead 970. The electrical lead 970 can be flexible, such as a flexible wire, and can have a length greater than or equal to half the receptacle spacing 965 on the system substrate 910.

Multiple electrical leads can be used to connect to different electrodes (such as the anode and cathode) of the EL device. Also, there can be multiple light emitting regions in a larger EL device, and multiple leads can be used to connect to the various light emitting regions of the EL device and drive them differently if needed. The electrical contacts, which are different for red, green, or blue EL devices, are formed with insulated leads that protrude from the EL device and connect to the plug. The leads can be bundled such that just one electrical cable extends from the EL device. One skilled in the art will recognize that the electrical leads can be used to attach plugs or receptacles to either the EL devices or the system substrate.

Smart System Substrate/Addressable Array

In addition to providing common drive conditions for all EL devices, or multiple drive conditions for a group of EL devices, a further embodiment provides a "smart system substrate". FIG. 11a is a top plan view, and FIG. 11b is a cross-sectional view of a light emitting apparatus with a smart system substrate. The EL devices can each have a back surface electrode which couples to the grid, and a protruding electrode which couples to one of the additional conductive paths in the addressable array.

The smart system substrate can comprise at least one of an identification (ID) device configured to uniquely identify at least one characteristic of an EL device, an electronic interface configured to receive a user input, or a sensor. A light emitting apparatus using a smart system substrate can further comprise a control module configured to independently drive each EL device coupled to the system substrate based on the information from the ID device, the user input, or the sensor.

In the light emitting apparatus 1100, the smart system substrate 1110 comprises a conductive grid 1120, which forms a first conductive path of the system substrate, and an array of additional conductive paths 1130 separated by insulating regions 1135. Each additional conductive path 1130 in the array is individually addressable by the control module. The conductive paths can be connected to the control module and electrical vias within the smart system substrate 1110.

EL devices 1140 each comprise a first electrode 1150 on the back surface, which is configured to make electrical contact with the conductive grid 1120. An additional electrode 1160 is configured to make electrical contact to one of the additional conductive paths 1130 in the array. As in former embodiments, the first and additional electrodes of the EL device can be electrically isolated from one another with insulating regions 1170. The first and additional conductive paths can be electrically isolated from one another with insulating regions 1135.

In FIGS. 11a and 11b, the first conductive path of the system substrate, which can be a conductive grid 1120, is raised or extends from the surface of the system substrate. The EL device 1140 in this case has a first electrode 1150 on the back surface to make electrical contact with the raised grid 1120, while the additional electrode 1160 of the EL device 1140 is a protruding electrode, which makes electrical connection with one of the additional conductive paths 1130 in the array.

Other embodiments can be envisioned in which the first and additional conductive paths of the system substrate lie in the plane of the system substrate surface. Where they are electrically disjoined on the surface, electrical vias can be built into the system substrate to connect the disjoined regions, or to connect each contact in the array to a control module 1180 or power supply. The control module 1180 can be connected to the light emitting apparatus 1100 with a flex connector and ribbon cable 1182.

When the conductive paths lie in the plane of the system substrate surface, the EL device can have multiple protruding electrodes—one to make contact to the first conductive path of the system substrate, and additional protruding electrodes to make contact to the additional conductive paths of the system substrate. At least one of the protruding electrodes can be moveable within a region of the back surface of the EL device as described above with respect to FIGS. 7a and 7b. In one embodiment, the protruding electrodes comprise button magnets configured to electrically and mechanically join the EL devices to the system substrate.

Electronics can be integrated into the EL device such that the EL device is always driven with the correct bias. A magnet on the EL device can also comprise a resistor or have a resistance such that it controls the voltage to the device depending upon the color of the EL device. One of the two protruding electrodes can comprise a fixed magnet while the other is moveable about a magnetic region on the back surface of the EL device. Instead of having a fixed magnet, a spring loaded connector or spring pin can be positioned on the EL device. In this case, one of the first or additional conductive paths on the system substrate would not need to be magnetic. In addition or alternatively, a spring loaded connector or spring pin can be attached to the button magnet to make contact with one of the conductive paths or electrodes. If the magnet has a high resistivity, the magnet can be coated with a conductor. Alternatively, the magnet can comprise a conductive core that passes through the magnet to form electrical contact with the EL device. In another embodiment, the fixed contact on the EL device can be a conductive hook-and-loop connector. A complimentary hook-and-loop connector would serve as one of the first or additional conductive paths on the system substrate.

In a further embodiment, the "push pin" or "post" EL devices can be used in conjunction with an addressable array. In this case, the addressable array can take the place of a conductive layer in the push pin embodiment. The addressable array can comprise a layer of addressable conductive regions in the system substrate. When a post is inserted into the system substrate, it makes contact with a first common conductive path or layer, and with an additional, addressable conductive region in the array. This addressable conductive layer can be positioned, for example, on the bottom surface of the system substrate. In order to prevent the post from making contact to an insulating region (rather than a contact in the array), a guiding grid can be formed on the bottom surface as well, to mechanically prevent insertion of the post at the undesirable location. The guiding grid and/or the addressable layer need not be on the bottom surface, but can be located anywhere on or between the top and bottom surfaces of the system substrate.

Using an addressable array, each EL device has unique x, y coordinates on the smart system substrate and can be individually identified and addressed by the control module 1180. The smart system substrate can be configured to scan each EL device to determine the necessary driving conditions. The control module can be used to uniquely drive each EL device. In FIG. 11a, the control module, which is configured to connect the EL devices to an external power supply through a cable 1185, independently drives the EL devices 1140 based on information collected by a sensor or sensor array 1190. The control module 1180 selectively drives the EL devices coupled to the system substrate at various locations on the array by selectively applying the desired voltage to each contact in the array.

In one embodiment, each identifiable category of EL devices (i.e. red, green, blue) has pre-assigned driving conditions. The smart system substrate, which can be aided by software, takes the identification of each EL device from an identification device, a user input, or a sensor, and correspondingly assigns the appropriate drive condition to the x, y coordinates of the EL device. Furthermore, software can be used to determine the number, emissive area, and position of each color EL device coupled to the system substrate and use this information to calculate a driving scheme for each EL device to produce light with certain color or intensity characteristics.

Mechanical coupling of the EL devices to the smart system substrate can be made with any of the mechanical coupling members described above. Additionally, any of the first or additional electrodes, the conductive grid, or the contact array can comprise an electromechanical coupling member such that when electrically joined, the EL device and system substrate are also mechanically joined.

Smart System Substrate Components

The smart system substrate can comprise an identification device for uniquely identifying at least one characteristic of each EL device, or an electronic interface that receives a user input such as a characteristic of the EL device. In addition, or alternatively, the smart system substrate can be connected to at least one sensor. The sensor can be configured to sense one of a temperature, a light spectrum, a movement, an acoustical frequency, a time, a light intensity, or a chemical composition. The drive conditions applied to each EL device can be based on information gathered from the identification device, user input, and/or sensed by the sensor.

Identification Device

The smart system substrate can comprise at least one identification device configured to uniquely identify at least one characteristic of one of the at least one EL device. A control module can be configured to independently drive the at least one EL device based on the characteristics identified. The identification device can be capable of probing each contact in an addressable array. Characteristics that can be identified include age, size, location on the system substrate, color, preferred drive condition, height, magnetic field, optical signature, or electrical signature.

The identification device can be a magnetic device, an optoelectronic device, a mechanical device, a digital device, or an analog device. It can be integrally built into the system substrate or can be apart from the system substrate. For instance, the identification device can be a unit located at a distance from the system substrate, but physically connected to the system substrate with an electrical cord, or wirelessly coupled to the system substrate through a wireless transmitter and receiver.

In one embodiment, an EL device comprises a magnet, and the identification device comprises a magnetic switch configured to be activated by the magnet. When EL devices of various colors, for instance, are used, EL devices with different desired drive conditions have magnets of different strengths to activate different switches in the system substrate. For example, a red EL device can have a low-strength magnet to activate a first switch. A green EL device can have a medium-strength magnet to activate the first switch and also a second switch, and a blue EL device can have a magnet with a field strong enough to activate the first and second switches as well as a third switch.

In one embodiment, a magnet-based identification device comprises a coil, and the EL device comprises a magnet configured to induce a current in the coil. The amplitude of the induced current can be used to identify the EL device.

In some embodiments, the EL device comprises a digital signature that can be read by the identification device. For example, the EL device can have an RFID tag configured to be read by the identification device, which can comprise an RFID reader. Information about the optimal drive conditions for each EL device can be stored in the RFID memory and communicated to the control module. In this embodiment, EL devices can be continually upgraded by a manufacturer and would still be compatible with an original system substrate because the desired drive conditions can be changed by the information on the RFID tag. The RFID tag can be an organic RFID tag formed with a similar or same process as the OLED, or integrally formed with the OLED.

In other embodiments, the identification device can be an optical detection device, such as a photodetector. A photodetector can be configured to measure coverage of the system substrate by an EL device, such that when an EL device is placed on a system substrate, it covers the photodetector, blocking ambient light. The blocked light indicates to the smart system substrate that a device has been placed in that location on the system substrate. Alternatively, the photodetectors can be used in conjunction with filters to measure the spectral characteristic of an EL device. For instance, three photodetectors can be placed in a position to read an EL device. Each photodetector has one of a red, a green, or a blue filter such that the signals from the photodetector will determine the placement and color of the EL devices.

In another embodiment, the EL device can have an optical signature or marker, and the identification device can comprise one of a camera or a scanner to read the optical signature. For example, a marker can be printed on each device, and a camera or scanner can be coupled to a computer that can read the image with an optical character recognition program.

In another embodiment, the identification device is configured to measure the current-voltage characteristics of at least one EL device. For example, a meter can be employed to measure the current-voltage (I-V) characteristics for each EL device connected to the addressable array. The color or other device characteristics of the EL device can be derived based on the current-voltage response either by differences in fundamental electrical characteristics of diodes (such as the slope of an I-V curve) or by incorporation of an identifying electrical feature or architecture that identifies the different devices. An identifying electrical feature can be any or a combination of the following: resistor, capacitor, tunnel junction, and diode. For instance, the identifying electrical feature could be measured in a forward bias or a reverse bias for an OLED. The electrical feature, built in parallel with the OLED device could comprise a forward-bias diode connected in series with a resistor or resistor-capacitor circuit. The features of this circuit can be used to identify the color or drive conditions of the EL device.

Once a color or another device characteristic is identified, programmed driving conditions for that unique device can then be used to drive the EL device in that position on the array. The smart system substrate can thus accommodate advancements in EL device technology. For instance, if blue EL devices achieve better efficiency or require lower drive voltages, an update to the smart system substrate software can be uploaded to change the drive conditions of the blue devices.

Sensor

Alternatively, or in addition to the identification device described above, the smart system substrate can comprise a sensor and a control module configured to independently drive the EL devices based on information collected by the sensor. The sensor can be configured to sense, e.g., one of a temperature, a light spectrum, a movement, an acoustical frequency, a time, a light intensity, or a chemical composition.

User Input

Alternatively, or in addition to the sensors and/or ID devices, the smart system substrate can comprise an electronic interface, such as a computer, that receives a user input such as at least one characteristic of an EL device. The control module can be configured to independently drive the EL devices based on the user input.

Control Module

The light emitting apparatuses described herein may comprise a control module. The control module may be used to control the color or intensity of the light output of the light emitting apparatus, or it may be used for wear leveling of the EL devices. Described below are control modules for light emitting apparatuses. The control module can comprise a smart system substrate. However, many of the features and characteristics of these control modules may also be incorporated in light emitting apparatuses that do not comprise a smart system substrate.

In light emitting apparatuses comprising a smart system substrate, a control module can be used to drive the EL devices. The control module can comprise a processor and a memory device. The EL device characteristics and the commands to generate drive conditions can be stored in the memory device. Each of the individual EL devices can be assigned a logical address, and the control circuit individually controls the EL devices based on their logical addresses. The control module can individually address and control the EL devices to adjust, e.g., the color, activation pattern, brightness, or to compensate for aging.

Software can be incorporated and configured to assign a preferred drive condition for each conductive path in the addressable array based on the characteristic of the EL device connected to that conductive path in the array. The identification device, user input electronic interface, and sensor can be configured to send information to the control module. The software can be configured to determine the drive conditions, and the control module can be configured to apply the desired drive conditions to the EL device.

The control module can be configured to drive the EL devices such that the light output of the apparatus has a desired intensity. Alternatively, or in addition, the control module can be configured to drive the EL devices such that the light output of the apparatus has a desired color characteristic such as a desired spectral power distribution, color rendering index, or correlated color temperature. For example, the memory device can store information about the number and size of different colored chips, and the control module can use this information to determine drive conditions to achieve desired far-field intensity and color characteristic (possibly correlating to a desired correlated color temperature with a maximum color rendering index) based on available plugged-in chip colors and dimensions. Thus, instead of changing the output color of the light emitting apparatus by selectively coupling different EL devices onto the system substrate, a color of the emitted light from the apparatus can also be tunable by selectively driving at least some of the EL devices differently from other EL devices. Selectively driving some of the plurality of EL devices differently from other EL devices can be realized by, for example, selectively varying a drive voltage or a drive current of the EL devices. Furthermore, the control module can be configured to drive the EL devices such that they flash or are activated in a pattern.

The control module can further comprise an input/output (I/O) interface to receive data used to control the light emitting apparatus or the EL devices. The input can be a user input provided by an electronic interface, feedback from a sensor, or a characteristic of an EL device provided by an identification device. The input can be received by the control module by wired or wireless communication with the identification device, electronic interface, or sensor. As an example, the input can be provided by a feedback mechanism, and the feedback mechanism can include, for example, a remote sensor for sensing a luminance of one or more of the EL devices. The output from the sensor can then be fed back to the control module. Based on the feedback, the control module can control the drive current or drive voltage of individual EL devices of the lighting system to adjust a color or intensity of light emission, or some other characteristics of the output light. A feedback data line in the form of a wire can be used to transmit feedback data from the sensor to the control module. Wireless transmission can also be used.

Instead of, or in addition to a remote sensor, one or more sensors can be located adjacent to individual EL devices to measure, for example, a measured current, a capacitance, or a junction temperature. These parameters can also be fed back to the control module to control the lighting system. The sensor can be configured to measure a luminance of one EL device at a time when the EL device is driven while neighboring EL devices are off, for example, when the plurality of EL devices are driven with pulsed current.

Using a smart system substrate, a variety of colors, shapes and sizes of EL devices can be used, and each EL device can be driven at its ideal settings. When EL device technology is advanced and new EL devices become available for use with the system substrate, a software update can allow compatibility of new EL devices with the same system substrate.

Color Tuning

Advantageously as a result of the modular design discussed in this application, the individual EL devices can be selected from a kit comprising devices with different color characteristics, sizes, and shapes.

At least one of the EL devices can be configured to be removably coupled to the system substrate, and the apparatus can be expandable to include more EL devices and more system substrates. Accordingly, a mixed color of the emitted light from the lighting system is adjustable by selectively replacing at least a subset of EL devices. For example, by replacing some of the blue EL devices with red EL devices, the color of the output light from the lighting system can be shifted toward a warmer color.

Alternatively, the individual EL devices can be individually addressed and controlled using, for example, the control module 112 shown in FIG. 1. The color of the emitted light from the light emitting apparatus 100 can be tunable by selectively driving at least some of the plurality of EL devices differently from other EL devices. Driving the EL devices differently can be realized by driving the EL devices to different activation levels. Such activation levels can include, for example, voltage levels, current levels, on/off states, and pulse widths.

For example, a drive voltage or a drive current of some of the plurality of EL devices can be selectively varied. By increasing the drive voltage or the drive current of the blue EL devices, the overall output color of the lighting system can be tuned toward a cooler color temperature.

In another example, some of the EL devices can be selectively turned on or off to adjust the output color and luminosity.

In yet another example, the EL devices can be driven in a pulse width modulation (PWM) method, where the activation levels of the EL devices can be determined by a drive pulse width. By selectively increasing the pulse width of, e.g., some of the blue EL devices, the output color of the lighting system can be tuned toward a cooler color temperature.

Wear Leveling

The control module can also be used to compensate for aging of the EL devices. Wear leveling refers to various approaches that can be undertaken to improve the overall aging profile of a collection of EL devices even when the individual EL devices within the collection have different aging profiles. Wear leveling is particularly useful when OLED devices are used. For example, blue OLEDs typically have shorter lifetime. The expected lifetime of conventional blue OLEDs is typically only about half that of red OLEDs or green OLEDs when operated at conditions such that a mixed light output has desired characteristics, e.g., at certain color coordinates in color space.

A wearing level of an EL device can be determined based on, for example, an accumulative duration that the EL device has been previously activated. The prior activation history of the EL device can be recorded in a memory device. The history can include, for example, drive voltage or current pulse width, frequency, amplitude, and accumulative duration. The wearing level of the EL device can also be characterized by a measured current, a capacitance, a junction temperature, or a luminance of the EL device. The current or the capacitance can be measured using the control module in conjunction with appropriate electrical circuitry. The parameters such as the junction temperature can be measured locally using a temperature sensor adjacent to, or embedded in, the active region. The luminance can be measured by an optical detector at a distance from the EL device.

Based on the wearing level or the expected wearing level of the EL devices, the control module can be used to drive the devices differently to substantially match their lifetimes and effectively expand the lifetime of the light emitting apparatus. For example, the OLED devices can be configured to be selectively activated to different levels. For example, at least some of the OLED devices can be configured to be selectively turned on or off based on a lifetime of the at least some of the plurality of OLED devices. In particular, newer devices can be intentionally activated to higher activation levels. Activating to higher activation levels can include, for example, turning on the device for a longer period of time or at a higher frequency, or driving the device at a higher current density. On the other hand, those OLED devices of larger number, as discussed above, or of larger sizes, can be activated to lower activation levels to match their lifetimes with other OLED devices while maintaining the color coordinates of the lighting system.

In a "low cost" approach, a control module is not necessary. Due to the modular design of the EL devices and their couplings to the system substrate, degraded EL devices can be simply replaced. In another approach, redundant EL devices can be activated in the lighting system to replace or augment the degraded devices. In yet another approach, devices with lower expected lifetime can be designed to have a larger emissive area, such that a desired light output can be achieved with a lower operating voltage. In conventional lighting systems, the lifetimes of different types of EL devices are not matched. For example, when blue EL devices reached their lifetime, EL devices of other colors would be still usable. However, the color coordinates of the lighting system would have changed due to the degradation of the blue EL devices. In some cases, this necessitates replacement of the entire lighting system.

Removable Coupling to a Discrete Location

Some embodiments describe light emitting apparatuses that comprise area emitting EL devices. The area emitting EL devices are configured to removably couple to a system substrate at a discrete location. The unique coupling members described above may be used to electrically and mechanically couple the EL devices to the system substrate. For example, coupling may be made by hook-and-loop connectors beaded stem fasteners, pins, plugs, magnets, adhesives, or other coupling members.

Various drive conditions as described above, including a common drive condition for all EL devices, a selection of drive conditions provided, or addressable control of individual EL devices, may be used in these light emitting apparatuses. The apparatus may have a control module configured to drive the EL devices at various activation levels. The control module may change the drive conditions to achieve a desired color characteristic or a desired intensity, for example. The control module can vary the activation levels of EL devices with time, for example, in a flashing, patterned activation, or dimming mode.

Figure 12A:
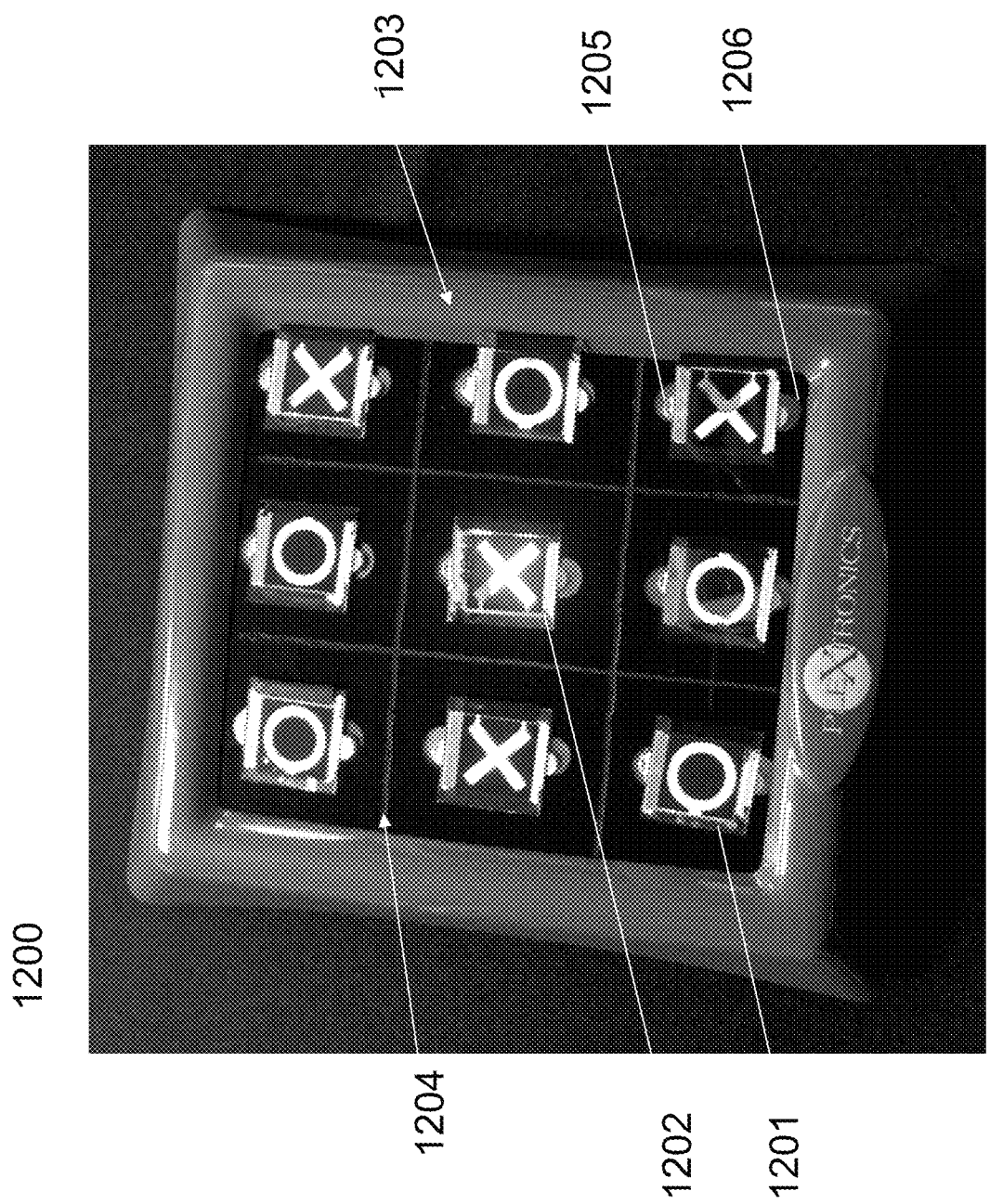
FIG. 12a is a photograph of a light emitting apparatus wherein area emitting EL devices are coupled mechanically and electrically to a system substrate at discrete locations.
Figure 12C:
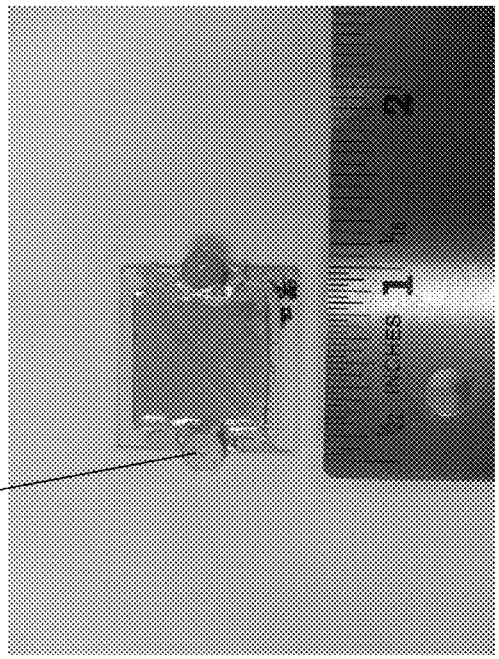
FIG. 12c is a photograph of the back side of an area emitting EL device from the light emitting apparatus of FIG. 12a. The ruler shows inches and cm.
Figure 12B:
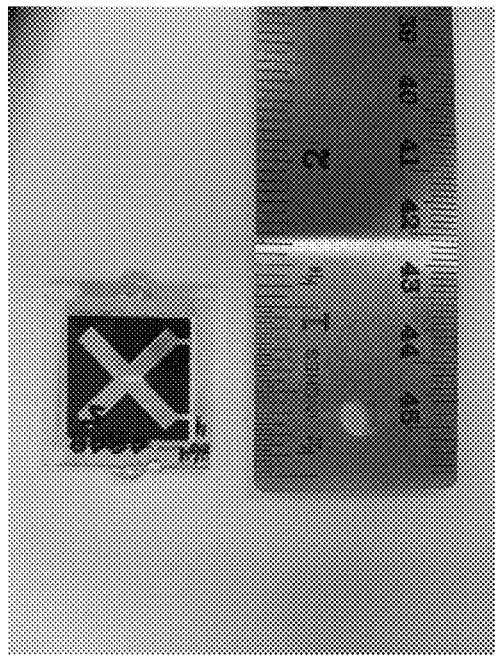
FIG. 12b is a photograph of the front side of an area emitting EL device from the light emitting apparatus of FIG. 12a. The ruler shows inches and cm.

The EL devices may have a variety of colors, shapes, and sizes. They may be flexible, rigid, or conformable. The system substrate may also be flexible, rigid, or conformable. The EL devices may couple to the system substrate at a variety of locations and orientations. For example, FIG. 12a shows a working example of a light emitting apparatus 1200 having area-emitting OLED devices 1201, 1202 coupled to a system substrate 1203 at discrete locations. The OLED devices are removably coupled electrically and mechanically. The OLED devices are patterned such that they emit light defining the shape of an "x" 1202 or an "o" 1201. FIG. 12B shows the front side of an OLED device. The structure of the device from the front to back is glass substrate/ITO patterned into a shape of an "x" or an "o"/active region/cathode/glass encapsulation. In FIG. 12C the back side of the OLED device is shown. On the back of the OLED device are two button magnets 1220, each of which electrically connects to one of the electrodes of the OLED device. The magnets 1220 are electrically conductive and are used to removably electrically and mechanically couple the OLED device to the system substrate 1203 as shown in FIG. 12A. The system substrate is configured to be used as a tic-tac-toe board in this application. On the system substrate is a tic-tac-toe board design 1204. Each tic-tac-toe square is configured to receive one OLED device. Each square comprises a magnetic electrical contact that connects to a first conductive path 1205 and one additional conductive path 1206 that in turn connect to a power supply. When the button magnets 1220 of the OLED device are coupled to the magnetic contacts of the system substrate 1203, the OLED device is powered and it illuminates as shown in FIG. 12A. The magnetic force is strong enough to keep the OLED devices coupled to the substrate, even when the system substrate is moved and inverted. However, by pulling the OLED device away from the system substrate, it can easily be removed. In this example, all devices are driven at a common voltage and rows of the system substrate contacts share a common magnetic strip. In this example, red 1202 and green 1201 OLED devices are simultaneously operated using a common drive condition. The OLED devices 1201, 1202 may be coupled to the system substrate 1203 one after another, alternating between coupling of "x's" and "o's" at any available receptacle on the system substrate board. Thus, a tic-tac-toe game may be played using this light emitting apparatus.

Light emitting apparatuses of this nature may also be used in other board games, phototherapy devices, grow lights, photographic lighting devices, projection lights, signs, or safety lights, for example.

Kit

The EL devices and system substrates can be applied to a user configurable mosaic, or modular design lighting. In particular, a kit of pre-manufactured EL devices can be provided, and the individual EL devices can be selected and "plugged" into a system substrate, thereby forming a configurable lighting system. The EL devices can be of various shapes, sizes, and colors to enable the user to create a light mosaic. The system can have desired optical properties, such as the color, by selecting a subset of EL devices from the kit.

The pre-manufactured EL devices such as those illustrated in FIG. 1a can be provided in a kit. The kit of pre-manufactured modular EL devices can include at least two types of EL devices of different colors. The kit can comprise instructions for selecting a subset of the supplied EL devices such that the apparatus emits light of desired color characteristics.

Phototherapeutic or color therapy EL devices can be provided in kits. These devices can emit at least one phototherapeutic or color therapy wavelength. For instance, an anti-aging phototherapy kit can comprise EL devices with wavelengths in the red, amber and near-IR range. Phototherapeutic treatment can be used for treating disorders of mood, sleep, skin, or hyperbilirubinemia, or seasonal disorders.

In addition to different colors, EL devices with different sizes, ranging from 0.1 $cm^2$ to 1 $m^2$, and different shapes such as circular, polygonal, numbers, and letters can be provided. In addition, EL devices can be configured to define a shape by blocking or transmitting light in the desired pattern on the EL device. The various shapes and sizes provided in the kit can be configured to permit signs to be made. EL devices provided in a kit can have shapes and colors that are affiliated with a special occasion or holiday theme. For instance, the colors red and green, and the shapes of evergreen trees and candy canes are associated with a Christmas holiday theme.

The EL devices provided in the kit can be selected to provide a substantially white light. The EL devices themselves can be white emitting devices, or EL devices of appropriate colors can be supplied to create a white light. The white light can be of color characteristics suitable for general illumination.

In one embodiment, the OLED devices are selected and coupled to the system substrate in a ratio based on their expected lifespan. For example, a two-to-one ratio between the number of blue OLEDs and the number of red OLEDs can be predetermined based on that the lifespan of the blue OLED is about half that of the red OLED.

In one example, more blue OLED devices, which typically have shorter life spans, are included in the lighting system, as compared with red or green OLED devices. For example, for every red or green OLED, two (2) blue OLED devices can be included. The two blue OLED devices can be alternately activated as controlled by a control module.

In a "low cost" approach, all the OLED devices can be simply driven by a same voltage, and the blue OLEDs can be configured to have higher resistance and thus lower current. This also would improve the lifespan of the blue OLED devices, while the increased number of these blue OLED devices compensates for the lower activation levels to realize the desired luminance and color characteristics.

During the wearing/aging of the lighting system, the color and other optical characteristics are thus effectively controlled by the selection of the OLED devices.

Details of the ratios of chip colors to be used to create different lighting conditions can be provided in accompanying instructions. In one embodiment, the kit comprises instructions for selecting a subset of EL devices such that the mixed light output of the subset of EL devices has a desired color characteristic.

In another embodiment, EL devices and a system substrate are provided wherein the system substrate is designed to function as a game board, and the EL devices are components, such as player pieces, that attach to the game board. In one embodiment, the system substrate game board is a tic-tac-toe board, and the plurality of EL devices have one of an "x" or "o" printed on the surface.

In another embodiment, the EL devices are configured to be interlocked as in a jigsaw puzzle when they are coupled to the system substrate, and can form a pattern on the substrate.

In another embodiment, EL devices are provided that have shapes and colors configured to be assembled on the system substrate to make a predefined pattern. For example, the EL devices of shapes and colors shown in FIG. 1a could be provided in a kit for user assembly. The pattern can also be a company logo or a sign. In a further embodiment, the system substrate comprises markings to indicate the coupling locations of the EL devices, such that a pattern or picture can be formed.

In another embodiment, a kit comprises a plurality of EL devices and a system substrate that are designed to look like a stained glass window when the EL devices are coupled to the system substrate. The kit can also contain a moldable material that can be placed between the EL devices to give the appearance of a frame or channeled lead.

The kit can comprise one or more system substrates. The system substrates can be independently or collectively controlled. They can be configured to be electrically and/or mechanically joined. The joining of system substrates can be in a modular fashion. A larger, three dimensional system substrate can be formed from individual system substrate components.

The EL devices are generally removably coupled to the system substrate, but they can also be configured to be permanently fixed to the system substrate. An adhesive can be supplied in the kit to provide a permanent fixture of the EL device to the system substrate.

The kit can further comprise a power supply.

The kit can further include instructional materials, including instructions on how to assemble and use the components, and the component specifications, as described throughout this disclosure. The instructions can include information such as ratios of chip colors to use to create light of a desired spectral characteristic.

A customer, such as a consumer electronics manufacturer or a consumer, can select a subset of EL devices from the kit, and assemble a lighting or signage apparatus with appropriate selection of EL devices having different colors and brightness.

Methods of Use

The light emitting apparatuses described above can be useful in a variety of applications including architectural lighting, signs, consumer novelty items, phototherapy, grow lights, decorative lighting, advertising, display lights, and general illumination. For general illumination, substantially white light is often preferred. A plurality of EL devices that have emission wavelengths that combine to make substantially white light can be selected and coupled to the system substrate. Upon powering the EL devices, white light can be generated.

Another method of use involves using the apparatus for phototherapy treatment. This involves the step of determining what condition is to be treated for the patient. A phototherapeutic wavelength and treatment duration to treat the condition is prescribed, the area of the patient to be illuminated by the phototherapeutic wavelength is determined, EL devices of the prescribed phototherapeutic wavelength are selected and coupled to the system substrate, the system substrate is mounted over the area of the patient to be illuminated and the EL devices are activated.

The light emitting apparatus can be used to form a light emitting sign. For this method of use, one can determine a message to display, select at least one system substrate with enough area to display the desired message, select EL devices that, when coupled to the system substrate, combine to form the desired message, couple the selected EL devices to the system substrate at a non-discrete location or orientation, mount the system substrate to display the message, and power the EL devices.

The light emitting apparatus can be used to create a light emitting advertisement. For this method of use, one can select EL devices that can combine to form the shape of a logo, couple the EL devices to at least one system substrate at non-discrete locations or orientations such that they form the logo, mount the system substrate to display the logo, power the EL devices, and, optionally, control the drive conditions of the EL devices to enable flashing, patterned activation, ramped light intensity, or activation based on feedback from a sensor.

Another method of using the light emitting apparatus is to create a light mosaic. This comprises selecting EL devices of various shapes and colors, coupling the EL devices to at least one system substrate to create a user-defined mosaic, mounting the system substrate, and powering the apparatus.

Further Embodiments

Embodiments described in priority provisional application 61/222,033 filed Jun. 30, 2009 are hereby incorporated by reference.

In some embodiments, an apparatus is provided having at least one EL device and a system substrate. The EL device is configured to be coupled mechanically and electrically to the system substrate and the system substrate is configured to receive the EL device at a non-discrete location or orientation. The EL device can be configured to be removably coupled mechanically and electrically to the system substrate.

The apparatus may additionally have a homogenizer. The EL device can be an area-emitting EL device. The area-emitting EL device can have a light emitting area of at least 0.5 cm$^2$, at least 2 cm$^2$, or at least 10 cm$^2$. The EL device can have a light emitting surface with a shape of a circle, a polygon, a number, a letter, a symbol, a character, or a figure. The shape can be a holiday shape. The shape can be a shape of a company logo or symbol.

The apparatus can comprise a plurality of EL devices of various sizes or shapes. The plurality of EL devices of various shapes can be configured to be arranged to form a logo or symbol. The apparatus can have a plurality of EL devices with emission wavelengths of at least two different colors. The EL device can be substantially transparent.

The EL device can comprise one of an organic light emitting diode (OLED) or a thin-film electroluminescence (TFEL) device. The OLED or TFEL can have a light out-coupling member. The EL device can be flexible or conformable. The EL device can have a shape, a figure, a character, a number, a letter, or an image, disposed thereon. The EL device can have an opaque or translucent cover configured to selectively block light to thereby define a shape, a figure, a character, a number, a letter, or an image. The opaque or translucent cover can comprise ink.

The system substrate can be flexible or conformable. The system substrate can be configured to be mounted on a wall or ceiling. The system substrate can be positioned on a curved surface. The system substrate can be substantially transparent. The system substrate can be configured to be free-standing. The system substrate can be expanded by connecting additional system substrates in a modular fashion. The system substrate can further comprise at least one light out-coupling member. At least one of the system substrate or the EL device can have a mechanical coupling member to provide mechanical coupling between the system substrate and the EL device.

The mechanical coupling member can be selected from one of a hook-and-loop connector, a beaded stem fastener, an adhesive, a putty, a tape, a push pin, a staple, a clip, or a magnet. The mechanical coupling member can be electrically conductive and configured to provide at least one electrical connection between the system substrate and the EL device. At least one of the system substrate or EL device can have at least one electrical coupling member configured to make electrical coupling between the system substrate and the EL device. The electrical coupling member can be one of a hook-and-loop connector, a beaded stem fastener, an adhesive, a putty, a tape, a push pin, a pin, a plug, a staple, or a magnet. The apparatus can additionally have a control module configured to drive the EL devices such that the light output of the apparatus has a desired spectral power density or a desired luminance. The apparatus can additionally have a control module configured to drive the EL devices such that they flash or are activated in a pattern.

In some embodiments, an apparatus is provided having at least one EL device and a system substrate. The EL device is configured to be coupled mechanically and electrically to the system substrate and the system substrate is configured to receive the EL device at a non-discrete location or orientation. The system substrate additionally has a cover, wherein at least one of the system substrate or cover is substantially transparent, and wherein the at least one EL device is configured to be coupled to the system substrate by sandwiching the EL device between the system substrate and the cover.

The EL device can have a bottom electrode and a top electrode, the system substrate can have a first conductive path, the cover can have a second conductive path, and the first and second conductive paths can be configured to electrically couple the bottom and top electrodes. At least one of the first and second conductive paths can be a substantially transparent conductive path. The substantially transparent conductive path can comprise a transparent conductive oxide, a PEDOT, a carbon nanotube, or a nanoparticle thin film.

The substantially transparent conductive path can comprise a metallic grid, wherein the grid is sufficiently thin to be substantially transparent. The substantially transparent conductive path can be disposed on glass or plastic. The cover can be configured to be connected to the system substrate with a hinge, a magnet, a clamp, an adhesive, or a screw. The cover can be completely removable from the system substrate.

The apparatus can additionally have a separating insulator configured to prevent the cover from making electrical contact with the system substrate. The mechanical coupling between the EL device and the system substrate can be provided substantially by a pressure applied between the cover and the system substrate. The apparatus can additionally have a foam, a sponge, or other materials capable of elastic deformation to aid in the mechanical coupling of the EL device to the system substrate.

In some embodiments, an apparatus is provided having at least one area emitting EL device and a system substrate. The area emitting EL device is configured to be coupled mechanically and electrically to the system substrate and the system substrate is configured to receive the EL device at a non-discrete location or orientation. The system substrate has a top surface, a bottom surface, and at least one conductive path, positioned on or between the top surface and the bottom surface.

The EL device has at least one post having at least one electrode. The post is configured to penetrate the system substrate to electrically connect at least one electrode of the EL device to at least one conductive path of the system substrate. The post can be configured to provide substantial mechanical coupling between the EL device and the system substrate. The post can be configured such that it does not provide substantial mechanical coupling of the EL device to the system substrate.

The apparatus can additionally have a control module for selectively activating EL devices by supplying electric current to the selected conductive paths of the system substrate. The EL device and the system substrate can be mechanically connected with a mechanical coupling agent selected from a hook-and-loop connector, a beaded stem fastener, an adhesive, a magnet, a putty, a tape, a staple, or a cover. The mechanical coupling member can be electrically conductive, and configured to provide an electrical connection between the EL device and the system substrate.

The post can have multiple electrodes, electrically isolated from one another. Each electrode can be configured to electrically connect to one of the conductive paths of the system substrate. Each electrode can be electrically exposed at a distance along the post, at a distance corresponding to the depth of a desired conductive path below the top surface of the system substrate such that the electrode makes electrical contact to the desired conductive path of the system substrate. The system substrate can comprise a cork, a foam, or a material penetrable by a push pin. The at least one conductive path of the system substrate can comprise an addressable array.

In some embodiments, an apparatus is provided having at least one area emitting EL device and a system substrate. The area emitting EL device is configured to be coupled mechanically and electrically to the system substrate and the system substrate is configured to receive the EL device at a non-discrete location or orientation. The system substrate has a top surface having a first conductive path and at least one additional conductive path positioned below the top surface. Each conductive path is electrically isolated from other conductive paths. The EL device has a first electrode configured to make electrical contact first conductive path of the system substrate and at least one post.

The post has at least one additional electrode configured to penetrate the system substrate such that the additional electrode is electrically connected to at least one additional conductive path of the system substrate. The EL device can additionally have at least one insulating sheath adjacent a base of the post to electrically isolate the additional electrode of the EL device from the first conductive path of the system substrate. The first conductive path of the system substrate can comprise a conductive foil. The conductive foil can be replaceable.

In some embodiments, an apparatus is provided having at least one EL device and a system substrate. The EL device is configured to be coupled mechanically and electrically to the system substrate and the system substrate is configured to receive the EL device at a non-discrete location or orientation. The system substrate has at least one receptacle and the EL device has at least one plug configured to electrically couple the EL device to the system substrate. The plurality of receptacles can be configured into an array.

The system substrate can additionally have a mechanical coupling member and the EL device can have a complementary mechanical coupling member, wherein the mechanical coupling members are configured to connect to provide substantial mechanical coupling of the EL device to the system substrate. The mechanical coupling member and the complementary mechanical coupling member can be conductive and can be configured to provide electrical coupling between the at least one EL device and the system substrate. The plug can comprise one of a pin or a magnet. The plug and receptacle can be connected with one of a spring loaded connector, magnetic force, threaded connector, or snap-in connector. The plug can be attached to the EL device with at least one electrical lead. The electrical lead can be flexible. The length of the electrical lead can be greater than or equal to half the receptacle spacing. The receptacle or plug can have a plurality of electrically isolated conductive paths.

The apparatus can additionally have a control module for selectively activating EL devices by supplying electric current to the selected conductive paths. Each plug can be configured to electrically couple to selected conductive paths of the receptacle depending upon the drive conditions desired to drive the EL device to which the plug is connected. The plug can be removably attached to the EL device.

In some embodiments, an apparatus is provided having at least one EL device and a system substrate. The EL device is configured to be coupled mechanically and electrically to the system substrate and the system substrate is configured to receive the EL device at a non-discrete location or orientation. The system substrate further comprises at least one conductive grid or array providing at least one of an electrical or mechanical coupling to the EL device.

The lateral dimensions of the EL device can be greater than or equal to the receptacle spacings. The conductive array can be an addressable array. The apparatus can additionally have a control module configured to selectively drive EL devices coupled to the system substrate at various locations on the array by selectively applying drive conditions. At least one grid or array can be on the surface of the system substrate. The apparatus can have conductive vias within the system substrate to connect components of the grid or array.

The EL device can additionally have at least one protruding electrode configured to make contact with the conductive grid or array on the surface of the system substrate. The protruding electrode can be a movable protruding electrode which is movable about a defined region on the EL device. The movable protruding electrode can comprise a button magnet. The apparatus can additionally have control means for selectively driving the at least one conductive grid or array.

The apparatus can have a plurality of conductive grids of various widths and a protruding contact of the EL device can have a width substantially equal to a width of a corresponding grid. The apparatus can have a plurality of conductive grids, wherein the plurality of conductive grids are recessed at various depths within the system substrate, and at least one protruding contact of the EL device can have a length substantially equal to a depth of a corresponding grid. The apparatus can have various grids or arrays that can be configured to supply various drive conditions to power the EL devices.

In some embodiments, an apparatus is provided having at least one EL device and a system substrate. The EL device is configured to be coupled mechanically and electrically to the system substrate and the system substrate is configured to receive the EL device at a non-discrete location or orientation. The system substrate further comprises at least one conductive grid or array providing at least one of an electrical or mechanical coupling to the EL device. The system substrate comprises a first conductive path and at least one additional conductive path, which comprises the at least one conductive grid or array.

The EL device comprises a first electrode and at least one additional electrode. The EL device is configured to electrically couple to the system substrate by connecting the first electrode to the first conductive path and connecting at least one additional electrode to at least one conductive grid or array. The conductive grid or array can be recessed into the system substrate and the additional electrode can protrude from the EL device to make contact with the recessed grid or array. The conductive grid or array can have an electromechanical coupling member, such that when the EL device is electrically coupled to the system substrate, it is also mechanically coupled to the system substrate.

At least one of the first conductive path or the at least one conductive grid or array can have an electromechanical coupling member, and at least one of the first electrode or at least one additional electrode of the EL device can have a complementary electromechanical coupling member, such that when the EL device is electrically coupled to the system substrate, the EL device is also mechanically coupled to the system substrate. The electromechanical coupling member can comprise one of a conductive hook-and-loop connector, a conductive adhesive, or a magnet.

In other embodiments, an apparatus is provided having at least one EL device and a system substrate. The EL device and system substrate are configured to be coupled together mechanically and electrically. The system substrate has at least one identification device configured to uniquely identify at least one characteristic of at least one EL device and a control module configured to independently drive at least one EL device based on the characteristic identified. The EL device can have at least one magnet, and the identification device can have a magnetic switch configured to be activated by the magnet.

EL devices with different desired drive characteristics can have magnets of different strength, such that the at least one magnetic switch is activated depending upon the strength of the magnet. The identification device can have a coil, and the EL device can have a magnet configured to induce a current in the coil. The amplitude of the induced current can be used to identify the EL device. The EL device can have a digital signature which is read by the identification device. The EL device can have an RFID tag, and the identification device can comprise an RFID reader. The EL device can have a thickness based on its desired drive characteristic, and the identification device can comprise a cover configured to measure location and height of the EL device.

The identification device can comprise an optical detection device. The identification device can comprise a photodetector. The photodetector can be configured to measure a coverage of the system substrate by an EL device. The photodetector can be configured to measure a spectral characteristic of the EL device. The EL device can have an optical signature, and the identification device can comprise one of a camera or scanner to read the optical signature. The identification device can be configured to measure current-voltage characteristics of at least one EL device. The current-voltage characteristics can be measured in at least one of a forward or a reverse bias.

The identification device can be configured to measure at least one of a resistive, a capacitive, a diode, or a tunneling characteristic. The identification device can comprise one of a magnetic, an optical, a mechanical, a digital, or an analog device. The identification device can be configured to be integrally built into the system substrate. The identification device can be physically separated from the system substrate. The identification device can be configured to wirelessly communicate with the control module.

The system substrate can have an addressable array of contacts, and the mechanical and electrical coupling of the EL device to the system substrate can result in the EL device making electrical connection to at least one contact in the array. The identification device can be capable of probing each contact in the array. The at least one characteristic of the EL device can be one of an age, a size, a location on the system substrate, a color, a preferred drive condition, a height, a magnetic field, an optical signature, or an electrical signature.

The control module can comprise a memory device. The EL device characteristics can be stored in the memory device. The apparatus can additionally have software configured to assign a preferred drive condition for each contact on the array based on the at least one characteristic of the EL device connected to that contact on the array.

The identification device can be configured to send information to the control module, the software can be configured to determine the correct drive conditions, and the control module can be configured to apply the desired voltage to EL device. The control module can be configured to drive the EL devices such that the light output of the apparatus has a desired spectral power density or luminance. The control module can be configured to drive the EL devices such that they flash or are activated in a pattern. The control module can be configured to drive the EL devices to obtain a desired far-field luminance. The control module can be configured to drive the EL devices such that the light output of the apparatus has a desired far-field spectral power density.

In another embodiment, an apparatus is provided having at least one EL device, at least one system substrate configured to receive the at least one EL device, an electronic interface that allows a user to input at least one characteristic of an EL device, and a control module configured to independently drive the at least one EL device based on the input characteristic.

In another embodiment, an apparatus is provided having at least one of EL device, a system substrate configured to have the EL device coupled thereto mechanically and electrically, a sensor, and a control module configured to independently drive at least some of the EL devices based on information collected by the sensor. The sensor can be configured to sense one of a temperature, a light spectrum, a movement, an acoustical frequency, a time, a light intensity, or a chemical composition.

In another embodiment, an apparatus is provided, having at least one self-powered EL device and at least one system substrate. The at least one self-powered EL device is configured to be coupled mechanically to the system substrate and there is non-discrete lateral positioning freedom or rotational freedom in the placement of the EL device.

In other embodiments, a kit is provided having a plurality of EL devices and at least one system substrate. At least some of the EL devices are configured to be coupled mechanically and electrically to the system substrate. The system substrate is configured to receive the EL devices at non-discrete locations or orientations and at least some of a plurality of EL devices can have different emission wavelengths. The kit can additionally have instructions for selecting a subset of the plurality of EL devices such that the apparatus emits light of desired color characteristics. The desired color characteristics can be suitable for lighting. The desired color characteristics can be suitable for a phototherapeutic treatment. The phototherapeutic treatment can be for treating disorders of mood, sleep, skin, hyperbilirubinemia, or seasonal affective disorders.

The plurality of EL devices can have colors or shapes that are compatible with a holiday or special occasion theme. The plurality of EL devices can include more blue EL devices than red or green devices. At least some of the plurality of EL devices can emit light in a manner that defines the shape of letters.

The system substrate can be designed to function as a game board. The game board can be a tic-tac-toe board, and the plurality of EL devices can have one of an "x" or "o" printed on the surface. At least some of the plurality of EL devices can be selected to have shapes and colors to make a predefined pattern on the system substrate. The system substrate can have markings to indicate the coupling locations of EL devices by color, shape, or size, such that a pattern or picture can be formed. The plurality of EL devices can include EL devices of various shapes, sizes, and colors to enable the user to create a light mosaic with the EL devices.

The system substrate and EL devices can be designed to look like a stained glass window when the EL devices are coupled to the system substrate, and the kit can additionally have a material that can be placed between EL devices to give the appearance of a frame or channeled lead. The EL devices can have jigsaw puzzle shapes and the kit can be configured to be used as a puzzle, wherein the EL devices are configured to be interlocked when coupled to the system substrate.

In one embodiment, a method of generating white light is provided, having the steps of selecting a plurality of EL devices that have emission wavelengths that can combine to make substantially white light, coupling the selected EL devices to a system substrate at a non-discrete location or orientation, and powering the EL devices.

In one embodiment, a method of treatment is provided, having the steps of determining the condition of a patient to be treated, prescribing at least one phototherapeutic wavelength and treatment duration to treat the condition, determining an area of the patient to be illuminated by the phototherapeutic wavelength, selecting at least one EL device of the prescribed phototherapeutic wavelength, coupling the selected EL devices to at least one system substrate at a non-discrete location or orientation, mounting the system substrate over the area of the patient to be illuminated, and powering the EL devices.

In one embodiment, a method of creating a light emitting sign is provided, having the steps of determining a message to display, selecting at least one system substrate with enough area to display the desired message, selecting EL devices that, when coupled to the system substrate, combine to form the desired message, coupling the selected EL devices to the system substrate at a non-discrete location or orientation, mounting the system substrate to display the message and powering the EL devices.

In one embodiment, a method of creating a light-emitting advertisement is provided, having the steps of selecting EL devices that can combine to form the shape of a logo, coupling the EL devices to at least one system substrate at non-discrete locations or orientations such that they form the logo, mounting the system substrate to display the logo, powering the EL devices, and, optionally, controlling the drive conditions of the EL devices to enable flashing, patterned activation, ramped light intensity, or activation based on feedback from a sensor.

In one aspect, a method of using a light emitting apparatus to create a light mosaic is provided, having the steps of selecting EL devices of various shapes and colors, coupling the EL devices to at least one system substrate to create a user-defined mosaic, mounting the system substrate, powering the apparatus.

The embodiments shown in FIGS. 1-12 are exemplary. Other embodiments can be prepared within the spirit and scope of the claims by one skilled in the art.

What is claimed is:

1. An apparatus comprising:
   at least one electroluminescence (EL) device; and
   a system substrate;
   wherein the at least one EL device is configured to be coupled mechanically and electrically to the system substrate,
   wherein the system substrate is configured to receive the at least one EL device at a non-discrete location or orientation,
   wherein the system substrate comprises at least one conductive grid or array providing at least one of an electrical or mechanical coupling to the EL device,
   wherein the at least one grid or array is on a surface of the system substrate,
   wherein the EL device further comprises at least one protruding electrode configured to make contact with the at least one conductive grid or array on the surface of the system substrate,
   wherein the at least one protruding electrode is a movable protruding electrode which is movable about a defined region on the EL device, and
   wherein the movable protruding electrode comprises a button magnet.

2. The apparatus of claim 1, wherein the at least one EL device is configured to be removably coupled mechanically and electrically to the system substrate.

3. The apparatus of claim 1, wherein the at least one EL device comprises an area-emitting EL device.

4. The apparatus of claim 1, wherein at least one EL device comprises an area emitting EL device, and wherein the area emitting EL device has a light emitting area of at least 0.5 cm2.

5. The apparatus of claim 1, wherein at least one EL device emits light that defines a shape of a circle, a polygon, a number, a letter, a symbol, a logo, a holiday shape, a character, or a figure.

6. The apparatus of claim 1, further comprising a plurality of EL devices of various sizes, shapes, colors, or a combination thereof.

7. The apparatus of claim 6, wherein the plurality of EL devices of various sizes, shapes, colors, or a combination thereof are configured to be arranged to form a pattern, a logo, or a symbol.

8. The apparatus of claim 1, wherein at least one of the system substrate or the EL device is substantially transparent.

9. The apparatus of claim 1, wherein the at least one EL device comprises one of an organic light emitting diode (OLED) or a thin-film electroluminescence (TFEL) device.

10. The apparatus of claim 1, wherein at least one of the system substrate or the at least one EL device is flexible or conformable.

11. The apparatus of claim 1, wherein the system substrate is configured to be free-standing or mounted on a surface.

12. The apparatus of claim 1, wherein the system substrate can be expanded by connecting additional system substrates in a modular fashion.

13. The apparatus of claim 1, wherein at least one of the system substrate or the at least one EL device further comprises a mechanical coupling member to provide mechanical coupling between the system substrate and the at least one EL device.

14. The apparatus of claim 13, wherein the mechanical coupling member is selected from one of a hook-and-loop connector, a beaded stem fastener, an adhesive, a putty, a tape, a push pin, a staple, a clip, or a magnet.

15. The apparatus of claim 13, wherein the mechanical coupling member is electrically conductive and is configured to provide at least one electrical connection between the system substrate and the at least one EL device.

16. The apparatus of claim 1, wherein at least one of the system substrate or the at least one EL device further comprises at least one electrical coupling member configured to electrically couple the system substrate and the at least one EL device.

17. The apparatus of claim 16, wherein the electrical coupling member comprises one of a hook-and-loop connector, a beaded stem fastener, an adhesive, a putty, a tape, a push pin, a pin, a plug, a staple, or a magnet.

18. The apparatus of claim 1, wherein the system substrate further comprises a cover, wherein at least one of the system substrate or the cover is substantially transparent, and wherein the at least one EL device is configured to be coupled electrically, mechanically, or both electrically and mechanically to the system substrate by sandwiching the EL device between the system substrate and the cover.

19. The apparatus of claim 18, wherein the at least one EL device comprises a bottom electrode and a top electrode, wherein the system substrate comprises a first conductive path, wherein the cover comprises a second conductive path, and wherein the first and second conductive paths are configured to electrically couple the bottom electrode and the top electrode.

20. The apparatus of claim 19, wherein at least one of the first and second conductive paths is a substantially transparent conductive path comprising a transparent conductive oxide, a PEDOT, a carbon nanotube, a nanoparticle thin film, or a metallic grid, wherein the grid is sufficiently thin to be substantially transparent.

21. The apparatus of claim 18, wherein a mechanical coupling between the EL device and the system substrate is provided substantially by a pressure applied between the cover and the system substrate.

22. The apparatus of claim 1, wherein the system substrate further comprises a first conductive path and wherein the at least one conductive grid or array comprises at least one additional conductive path, wherein the EL device comprises at least one additional electrode, and wherein the EL device is configured to electrically couple to the system substrate by connecting the at least one additional electrode to the first conductive path and connecting the at least one protruding electrode to the at least one additional conductive path.

23. The apparatus of claim 22, wherein the at least one conductive grid or array is recessed into the system substrate; and wherein the at least one protruding electrode protrudes from the EL device to make contact with the at least one recessed grid or array.

24. The apparatus of claim 22, wherein at least one of the first conductive path or the at least one conductive grid or array comprises an electromechanical coupling member, and wherein at least one of the first electrode or the at least one additional electrode of the EL device comprises a complementary electromechanical coupling member, such that when the EL device is electrically coupled to the system substrate, the EL device is also mechanically coupled to the system substrate.

25. The apparatus of claim 1, wherein the EL device has a lateral dimension which is greater than or equal to a receptacle spacing.

26. The apparatus of claim 1, wherein the conductive grid or array is an addressable grid or array.

27. The apparatus of claim 26, further comprising a control module configured to selectively drive the EL devices coupled to the system substrate at various locations on the conductive grid or array by selectively applying drive conditions.

28. The apparatus of claim 1, wherein the system substrate further comprises conductive vias configured to connect components of the grid or array.

29. The apparatus of claim 1,
wherein the system substrate further comprises:
a first conductive path, and
a plurality of recessed conductive grids or arrays, at least one conductive grid or array providing at least one of an electrical or mechanical coupling to the EL device, the at least one conductive grid or array comprising at least one additional conductive path,
wherein the EL device comprises a first electrode and at least one additional electrode,
wherein the EL device is configured to electrically couple to the system substrate by connecting the first electrode to the first conductive path and connecting at least one additional electrode to the at least one conductive grid or array,
wherein the at least one conductive grid or array is recessed into the system substrate,
wherein at least one additional electrode protrudes from the EL device to make contact with the at least one recessed grid or array,
wherein the plurality of conductive grids or arrays are of various widths, and
wherein at least one protruding electrode of the EL device has a width corresponding to a width of a corresponding grid or array.

30. The apparatus of claim 1,
wherein the system substrate further comprises:
a first conductive path, and
a plurality of conductive grids or arrays, at least one conductive grid or array providing at least one of an electrical or mechanical coupling to the EL device, wherein the at least one conductive grid or array comprises at least one additional conductive path and,
wherein the EL device comprises a first electrode and at least one additional electrode,
wherein the EL device is configured to electrically couple to the system substrate by connecting the first electrode to the first conductive path and connecting at least one additional electrode to the at least one conductive grid or array,
wherein at least one conductive grid or array is recessed into the system substrate,
wherein at least one additional electrode protrudes from the EL device to make contact with the at least one recessed grid or array, wherein the plurality of conductive grids or arrays are recessed at various depths within the system substrate, and wherein at least one protruding contact of the EL device has a length substantially equal to a depth of a corresponding grid or array.

31. The apparatus of claim 1, wherein various grids or arrays are configured to supply various drive conditions to the EL devices.

32. The apparatus of claim 1, further comprising a control module, wherein the control module is configured to drive the EL devices such that a light output of the apparatus has at least one of a desired color characteristic or a desired intensity.

33. The apparatus of claim 1, further comprising a control module, wherein the control module is configured to drive the EL devices such that they flash or are activated in a pattern.

34. The apparatus of claim 1, further comprising a control module configured to independently drive the at least one EL device.

35. The apparatus of claim 34, wherein the control module is configured to receive an input from a sensor, an electronic interface, or an identification device via wireless communication.

36. The apparatus of claim 34, wherein the control module is configured to drive the EL devices such that a light output of the apparatus has at least one of a desired color characteristic or a desired intensity.

37. The apparatus of claim 34, further comprising an electronic interface configured to receive a user input, wherein the control module is configured to independently drive the at least one EL device based on the user input.

38. The apparatus of claim 34, further comprising a sensor, wherein the control module is configured to independently drive the at least one EL device based on information collected by the sensor.

39. The apparatus of claim 38, wherein the sensor is configured to sense one of a temperature, a light spectrum, a movement, an acoustical frequency, a time, a light intensity, or a chemical composition.

40. The apparatus of claim 34, further comprising at least one identification device configured to uniquely identify at least one characteristic of the at least one EL device, wherein the control module is configured to independently drive the at least one EL device based on the at least one characteristic identified.

41. The apparatus of claim 40, wherein the at least one identification device comprises a magnetic switch configured to be activated by at least one magnet of the EL device.

42. The apparatus of claim 40, wherein the identification device comprises a coil, and wherein the EL device comprises a magnet configured to induce a current in the coil.

43. The apparatus of claim 40, wherein the EL device further comprises an radio frequency identification (RFID) tag, and wherein the at least one identification device comprises an RFID reader.

44. The apparatus of claim 40, wherein the identification device comprises an optical detection device.

45. The apparatus of claim 44, wherein the identification device comprises one of a photodetector, a camera, or a scanner configured to measure one of a spectral characteristic or a coverage of the system substrate by the at least one EL device.

46. The apparatus of claim 40, wherein the identification device is configured to measure an electrical characteristic of at least one EL device.

47. The apparatus of claim 40, wherein the identification device comprises one of a magnetic, an optical, a mechanical, a digital, or an analog device.

48. The apparatus of claim 40, wherein the system substrate comprises an addressable array of contacts; wherein the mechanical and electrical coupling of the at least one EL device to the system substrate results in the EL device making an electrical connection to at least one contact in the array; and wherein the identification device is capable of probing each contact in the array.

49. The apparatus of claim 48, wherein the control module comprises software configured to assign a preferred drive condition for each contact in the array based on the at least one characteristic of the EL device connected to that contact on the array.

50. The apparatus of claim 40, wherein the at least one characteristic of the EL device is one of an age, a size, a location on the system substrate, a color, a preferred drive condition, a height, a magnetic field, an optical signature, or an electrical signature.

51. A kit comprising:
a plurality of electroluminescence (EL) devices; and
at least one system substrate;
wherein at least some of the plurality of EL devices are configured to be coupled mechanically and electrically to the at least one system substrate; and
wherein the at least one system substrate is configured to receive at least some of the plurality of EL devices at a non-discrete location or orientation,
wherein the at least one system substrate comprises at least one conductive grid or array providing at least one of an electrical or mechanical coupling to the EL devices,
wherein the at least one grid or array is on a surface of the system substrate,
wherein at least one of the EL devices further comprises at least one protruding electrode configured to make contact with the at least one conductive grid or array on the surface of the system substrate,
wherein the at least one protruding electrode is a movable protruding electrode which is movable about a defined region on the EL device, and
wherein the movable protruding electrode comprises a button magnet.

52. The kit of claim 51, wherein at least some of the plurality of EL devices have different colors, shapes, or sizes.

53. The kit of claim 51, further comprising instructions for selecting a subset of the plurality of EL devices such that a mixed light output of the subset of EL devices has a desired color characteristic.

54. The kit of claim 51, wherein at least some of the plurality of EL devices are configured to emit light of a phototherapeutic wavelength.

55. The kit of claim 51, wherein at least some of the plurality of EL devices have colors or shapes that are compatible with a holiday or special occasion theme.

56. The kit of claim 51, wherein at least some of the plurality of EL devices are capable of producing a mixed light output that is substantially white.

57. The kit of claim 51, wherein at least some of the plurality of EL devices emit light that defines a shape of a letter.

58. The kit of claim 51, wherein at least some of the plurality of EL devices are selected to have shapes and colors configured to make a predefined pattern on the at least one system substrate.

59. The kit of claim 51, wherein the at least one system substrate has markings to indicate coupling locations of at least some of the plurality of EL devices by color, shape, or size, such that a pattern or picture can be formed.

60. The kit of claim 51, wherein the plurality of EL devices includes EL devices of various shapes, sizes, or colors, or a combination thereof to enable a user to create a light mosaic with the plurality of EL devices.

61. The kit of claim 51, wherein the at least one system substrate and the plurality of EL devices are configured to look like a stained glass window when the EL devices are coupled to the at least one system substrate.

62. The kit of claim 61, further comprising a material that can be placed between EL devices to give an appearance of channeled lead.

63. The kit of claim 51, wherein the EL devices have jigsaw puzzle shapes, and wherein the EL devices are configured to be interlocked when coupled to the system substrate.

64. An apparatus comprising:
at least one electroluminescence (EL) device; and
a system substrate;
wherein the at least one EL device is configured to be coupled mechanically and electrically to the system substrate,
wherein the system substrate is configured to receive the at least one EL device at a non-discrete location or orientation,
wherein the system substrate further comprises:
a first conductive path, and
a plurality of recessed conductive grids or arrays, at least one conductive grid or array providing at least one of an electrical or mechanical coupling to the EL device, the at least one conductive grid or array comprising at least one additional conductive path,
wherein the EL device comprises a first electrode and at least one additional electrode,
wherein the EL device is configured to electrically couple to the system substrate by connecting the first electrode to the first conductive path and connecting at least one additional electrode to the at least one conductive grid or array,
wherein the at least one conductive grid or array is recessed into the system substrate, and
wherein at least one additional electrode protrudes from the EL device to make contact with the at least one recessed grid or array,
wherein the plurality of conductive grids or arrays are of various widths, and
wherein at least one protruding electrode of the EL device has a width corresponding to a width of a corresponding grid or array.

* * * * *